(12) United States Patent
Swihart et al.

(10) Patent No.: US 11,956,522 B2
(45) Date of Patent: Apr. 9, 2024

(54) ELECTRONIC COMPONENT ASSEMBLY WITH THERMALLY CONDUCTIVE STRUCTURES FOR IMAGE SENSORS

(71) Applicant: BIO-RAD LABORATORIES, INC., Hercules, CA (US)

(72) Inventors: Stephen Swihart, Walnut Creek, CA (US); Li Lu, Livermore, CA (US); Wade Jameson, Mesa, AZ (US); Evan Thrush, San Anselmo, CA (US); Michael Griffin, El Cerrito, CA (US); Evelio Perez, Hercules, CA (US)

(73) Assignee: BIO-RAD LABORATORIES, INC., Hercules, CA (US)

( * ) Notice: Subject to any disclaimer, the term of this patent is extended or adjusted under 35 U.S.C. 154(b) by 0 days.

(21) Appl. No.: 18/063,946

(22) Filed: Dec. 9, 2022

(65) Prior Publication Data

US 2023/0109519 A1    Apr. 6, 2023

Related U.S. Application Data

(63) Continuation of application No. 17/108,672, filed on Dec. 1, 2020, now Pat. No. 11,553,116.

(60) Provisional application No. 62/944,611, filed on Dec. 6, 2019.

(51) Int. Cl.
| | |
|---|---|
| *H04N 5/335* | (2011.01) |
| *H04N 23/52* | (2023.01) |
| *H04N 23/55* | (2023.01) |
| *H05K 7/20* | (2006.01) |

(52) U.S. Cl.
CPC ............. *H04N 23/52* (2023.01); *H04N 23/55* (2023.01); *H05K 7/20472* (2013.01)

(58) Field of Classification Search
CPC .................................................. H05K 7/20472
See application file for complete search history.

(56) References Cited

U.S. PATENT DOCUMENTS

| | | | | |
|---|---|---|---|---|
| 7,911,017 | B1 * | 3/2011 | de Guzman | ...... H01L 27/14618 257/E31.127 |
| 11,092,321 | B2 * | 8/2021 | Bonne | ..................... H05K 1/182 |
| 2011/0266441 | A1 | 11/2011 | Fagan, III et al. | |
| 2017/0345864 | A1 * | 11/2017 | Kinsman | ........... H01L 27/14618 |
| 2018/0226515 | A1 * | 8/2018 | Skeete | ................ H01L 27/1469 |

OTHER PUBLICATIONS

International Search Report/Written Opinion, International Application No. PCT/US2020/062706, dated Mar. 9, 2021, PCT/ISA/210, PCT/ISA/220, PCT/ISA/237, 22 pages.

* cited by examiner

*Primary Examiner* — Gary C Vieaux
(74) *Attorney, Agent, or Firm* — Saliwanchik, Lloyd & Eisenschenk

(57) ABSTRACT

An electronic component assembly having thermal pads with thermal vias coupling an image sensor and a camera board fab is provided for heat dissipation. The electronic component assembly can include: a circuit board having at least one thermal pad disposed on a top surface of the circuit board; and an image sensor disposed on the top surface of the circuit board, having at least one conductive pad disposed at at least one corner of the image sensor. The at least one thermal pad is coupled to the at least one conductive pad of the image sensor and the at least one thermal pad is formed with a plurality of first thermal vias penetrating the thermal pad and the circuit board for transfer of heat of the image sensor.

16 Claims, 43 Drawing Sheets

| Configuration | Temperature (C) | Dark Current (e/px/s) |
|---|---|---|
| Rev 5 (Uncooled Design) with Cu Back and TEC powered on | 18 | 0.025 |
| Rev 5 board with lens, no Cu back or TEC attached) | 29 | 0.16 |
| Rev 5 (Uncooled Design) with Cu Back and TEC attached, not powered | 33 | 0.31 |
| Rev 5 board, nothing attached to back, no lens | 39 | 0.41 |

Figure 36

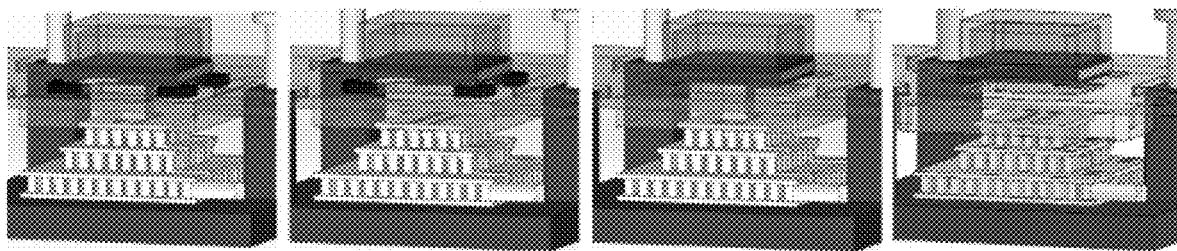

| | Copper finger + Vias | Vias only | Finger only | Without finger and vias |
|---|---|---|---|---|
| Pocket | 31.8 | 32.6 | 31.9 | 34.7 |
| Sensor | -12.9 Better than next best by 2C | -9.8 | -10.9 | 10.3 Worse by nearly 24C |
| Camera Barrel | 40.0 | 40.0 | 39.9 | 40.1 |

❖ Simulated at TEC temperature (cold side = -15C, hot side = 45C)
❖ Finger cross-section size 4mm*4mm

Figure 37

| Cover Type | Thickness | Material | Measured Temp (C) | | | TEC cold/sensor Temp (C) | | Time to Plateau |
| --- | --- | --- | --- | --- | --- | --- | --- | --- |
| | | | Top Pocket | Copper Plate | Ambient | With block/pocket | Nothing on top | |
| block | 12 mm | Acrylic | 26.4 | 32.4 | 25 | -12 | -15 | 28 min |
| pocket | 12 mm | Acrylic | 28.5 | 33.1 | 25.3 | -10.4 | -15 | 35 min |
| block | 6 mm | Acrylic | 22.8 | 34.2 | 25.1 | -8.1 | -15 | 25 min |
| pocket | 6 mm | Acrylic | 27.6 | 35.5 | 25.7 | -8.6 | -15 | 24 min |
| block | 6 mm | Borosilicate | 26.8 | 33.2 | 25.4 | -7.8 | -15 | 24 min |
| pocket | 6 mm | Borosilicate | 28.9 | 33.8 | 25.5 | -7.9 | -15 | 27 min |
| block | 12 mm | Borosilicate | 25.8 | 30.4 | 25 | -9.3 | -15 | 27 min |

Figure 38

ELECTRONIC COMPONENT ASSEMBLY WITH THERMALLY CONDUCTIVE STRUCTURES FOR IMAGE SENSORS

CROSS-REFERENCE TO RELATED APPLICATIONS

The present application is a continuation application of U.S. patent application Ser. No. 17/108,672, filed Dec. 1, 2020, which claims the benefit of U.S. Provisional Application Ser. No. 62/944,611, filed Dec. 6, 2019, the disclosures of each of which are hereby incorporated by reference herein in their entirety, including all figures, tables, and drawings.

BACKGROUND

Instruments and apparatus systems that are used for viewing, recording, and analyzing the results of biological and chemical tests and assays often require instrumentation such as a charge-coupled device (CCD) camera, a complementary metal-oxide-semiconductor (CMOS) imager, or other such image sensor. The older CCD and CMOS package designs as shown in FIG. 1, left a lot of room on the back side of the image sensor to attach cold fingers for heat dissipation. For instance, FIG. 2(a) provides a schematic representation of Sony ICX 695 CCD image sensor with the box area indicating an area where the cold fingers could contact the image sensor.

However, the more modern CMOS image sensor, such as a Sony IMX 178 image sensor shown in FIGS. 2(b) and 2(d), or a Sony IMX183 image sensor shown in FIG. 2(c), have an architecture of grid arrays and thus do not have much available areas for the cold fingers to contact for thermal dissipation.

All other things being equal, the heat conduction using a conventional cold finger is proportional to the area of the image sensor and can be determined by the following equation:

$$Q = \frac{KA(T_{Hot} - T_{Cold})}{d}$$

where:

$Q$ = heat conduction$(W)$ $K$ = material thermal conductivity$(W/mK)$ $A$ = cross-sectional area $T_{Hot}$ = higher temperature(°C. or °K.)

$T_{Cold}$ = colder temperature(°C. or °K.)

$d$ = material thickness

Therefore, the heat conducted out of the older image sensor Sony ICX695 (with an area of 160 mm$^2$) of FIG. 2(a) is 18.3 times faster than the heat conducted out of the more modern image sensor Sony IMX178 (with an area of 8.75 mm$^2$) of FIG. 2(b); and the heat conducted out of the older image sensor Sony ICX695 (with an area of 160 mm$^2$) of FIG. 2(a) is 8 times faster than the heat conducted out of the more modern image sensor Sony IMX183 (with an area of 20 mm$^2$) of FIG. 2(c).

Nevertheless, some existing image sensors comprise pads located at corners of the image sensor as shown in FIG. 2(d). Even if the corner pads are not directly connected with each other by vias inside body of the image sensor, the bulk heat conduction inside the body of the image sensor will pull heat away when the corner pads are cooler than the bulk silicon of the pixel plane of the image sensor.

BRIEF SUMMARY

There continues to be a need in the art for improved designs and techniques for an image sensor assembly with thermally conductive structures for dissipating heat from the image sensor to maintain a controlled temperature for operations of the image sensor.

Embodiments of the subject invention pertain to an electronic component assembly having thermal pads with thermal vias for transferring heat from the image sensor, and an image sensor assembly with active cooling by a thermoelectric cooling element (TEC) for heat dissipation from the image sensor.

According to an embodiment of the invention, an electronic component assembly can comprise a circuit board comprising at least one thermal pad disposed on a top surface of the circuit board; and an image sensor disposed on the top surface of the circuit board, comprising at least one conductive pad disposed at at least one corner of the image sensor; wherein the at least one thermal pad is coupled to the at least one conductive pad of the image sensor; and wherein the at least one thermal pad is formed with a plurality of first thermal vias penetrating the thermal pad and the circuit board for transfer of heat of the image sensor. The electronic component assembly can further comprise a thermally conductive layer disposed on a bottom surface of the circuit board, wherein the thermally conductive layer is made of metal, has a circular or annular shape, and has a plurality of second thermal vias penetrating the thermally conductive layer and being spaced in the thermally conductive layer to transfer heat. Moreover, the electronic component assembly can further comprise a thermal compound material applied between corner areas of the image sensor and corner areas of the thermal pad comprising the thermal vias and extending along lengths of the first thermal pad. The electronic component assembly can further comprise a cooling structuring coupled to the circuit board for transferring heat, wherein the cooling structuring comprises at least one cold finger structure protruding through a through-hole of the circuit board and contacting a surface of the image sensor for transferring heat. Furthermore, the electronic component assembly can comprise a lens mount for mounting the lens, wherein the lens mount and the image sensor are horizontally disposed on a same surface of the top surface of the circuit board.

In another embodiment, an image sensor assembly can comprise a cooling structure comprising at least one thermoelectric cooling element (TEC); a circuit board disposed on the cooling structure; an image sensor; and a lens. The image sensor assembly can further comprise an image sensor cover disposed on the image sensor, the lens and the image sensor cover directly contacting or indirectly contacting through a sil pad or graphoil, a lens outer barrel in contact with the image sensor cover, a heat sink structure coupled to the cooling structure, a plurality of fasteners coupling the lens outer barrel to the heat sink structure, wherein the image sensor assembly comprises a structure with a chamber or a structure without a chamber. Moreover, the heat can be transferred from the lens outer barrel to the sil pad or graphoil, from the sil pad or graphoil to the image sensor cover, from the image sensor cover to the image sensor, from the image sensor to the circuit board, from the circuit board to the cooling structure, from the cooling structure to the heat sink. The image sensor cover can be configured to be a solid block of minimal thermal conductivity bonded to the image sensor or a pocket bonded to some or all portions of the image sensor to provide heat to the top surface to avoid condensation when the image sensor is cooled. Heat can be additionally piped through the circuit board with corner pads, central finger, or both. The image sensor assembly can additionally comprise a plurality of gaskets disposed between the lens outer barrel and the circuit board to reduce heat transfer from the lens outer barrel, a plurality of, for example three, reduced areas where the gaskets contact the circuit board and the gaskets make up the intervening space to block light from getting to the image sensor. The image sensor assembly can further comprise a plurality of washers preferably in a form of Belleville washers, respectively disposed between the plurality of gaskets and the circuit board for tilt adjustment. The image sensor assembly can further comprise a lens mount for mounting the lens, and the image sensor and the lens mount can be horizontally disposed on a same plane of the top surface of the circuit board or the image sensor and the lens mount can be disposed to vertically overlap on the top surface of the circuit board.

BRIEF DESCRIPTION OF DRAWINGS

FIG. 36 is a table showing a summary of measurements of dark currents of an image sensor for four different cooling structures.

FIG. 37 is a table showing a summary of results of simulations of temperature profiles the configurations shown in cross-section in the upper portion of the figure.

FIG. 38 is a table showing a summary of temperatures of an image sensor for different cooling structures of an image sensor cover.

DETAILED DESCRIPTION

Embodiments of the subject invention pertain to an electronic component assembly having thermal pads with thermal vias for transferring heat from the image sensor, and an image sensor assembly with active cooling by a thermoelectric cooling element (TEC) for heat dissipation from the image sensor.

Figure 1:
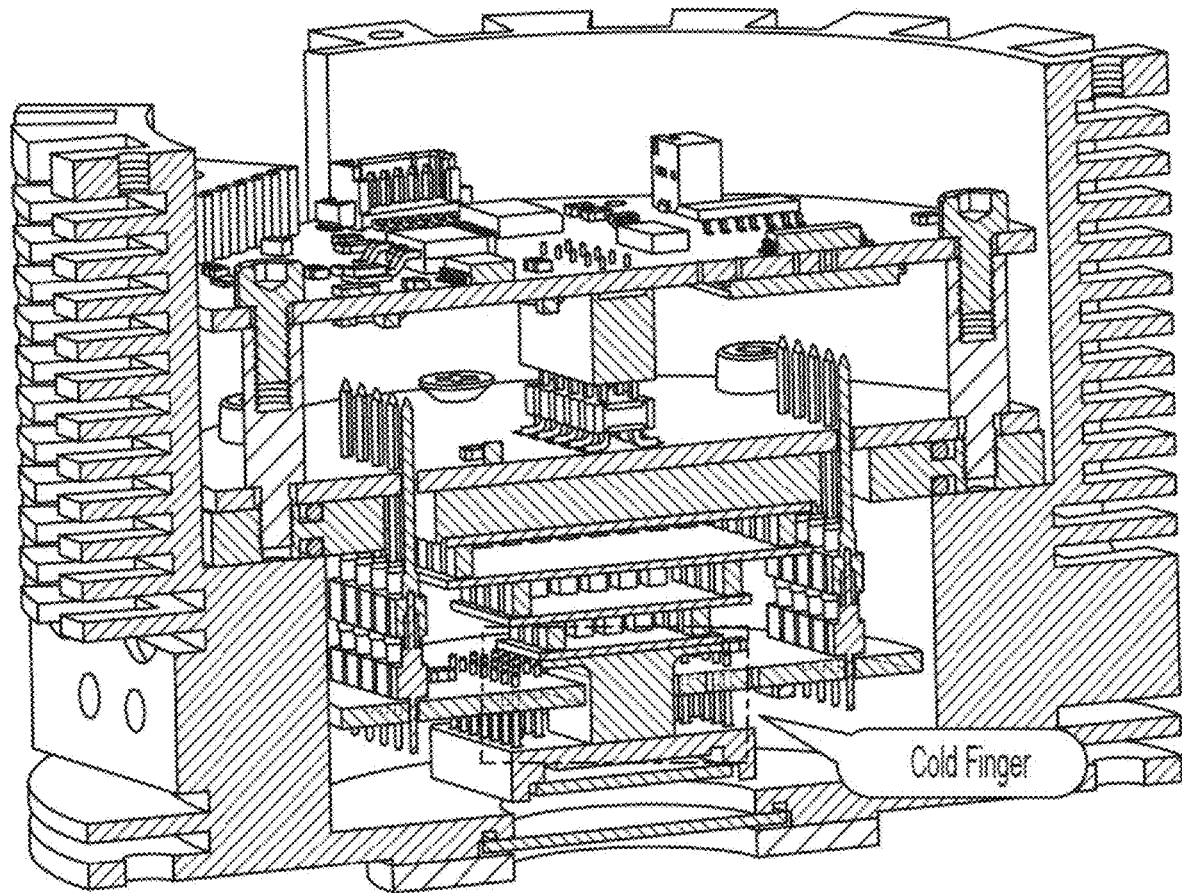
FIG. 1 is a perspective view of a cooled-camera imager having cold fingers according to the related art.
Figure 2A:
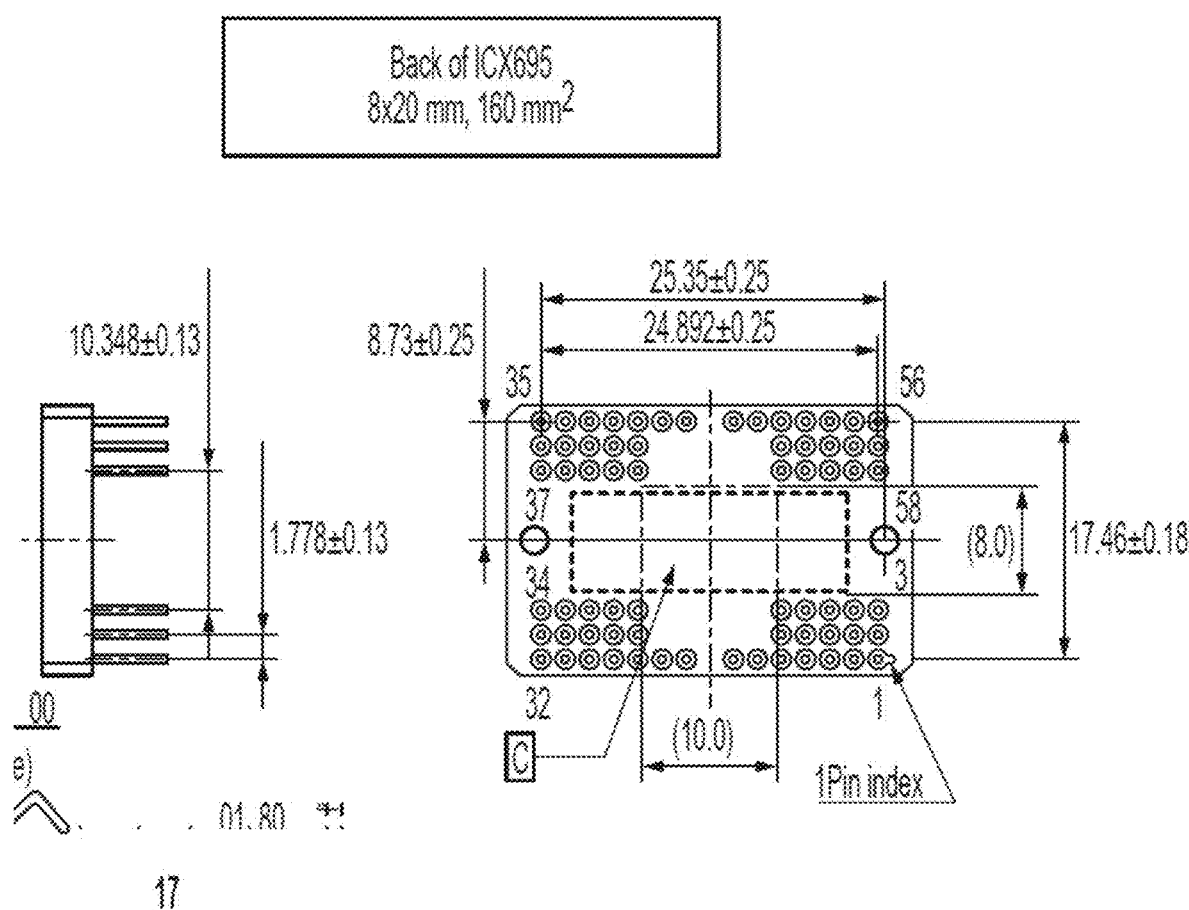
FIGS. 2(a), (b) and (c) are schematic representations of a Sony ICX695 image sensor, a Sony IMX178 image sensor, and a Sony IMX183 image sensor, respectively.
Figure 2B:
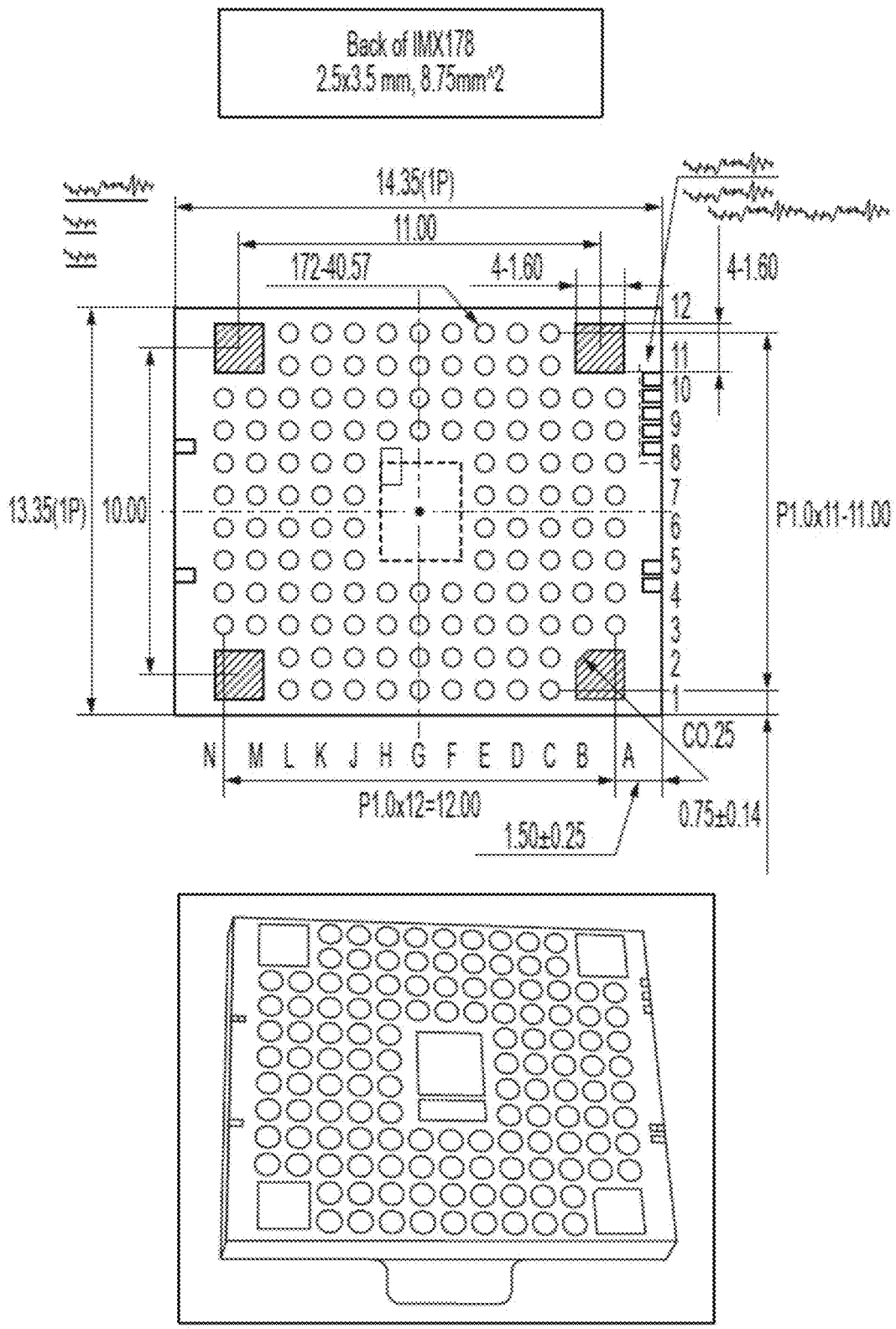
FIG. 2(d) is a view of the Sony IMX178 image sensor's back or electrical contact side, according to the related art.
Figure 2C:
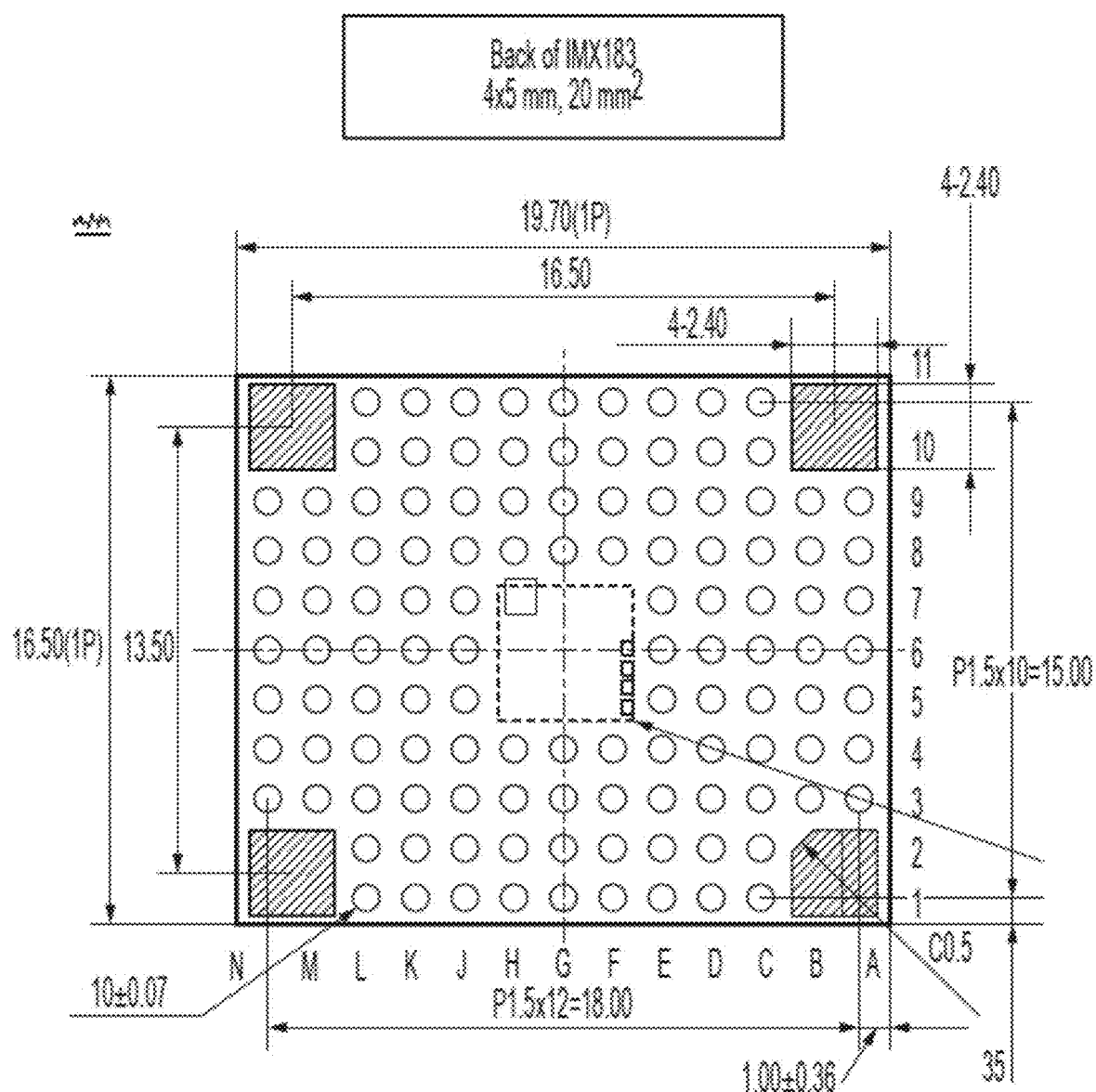
Figure 2D:
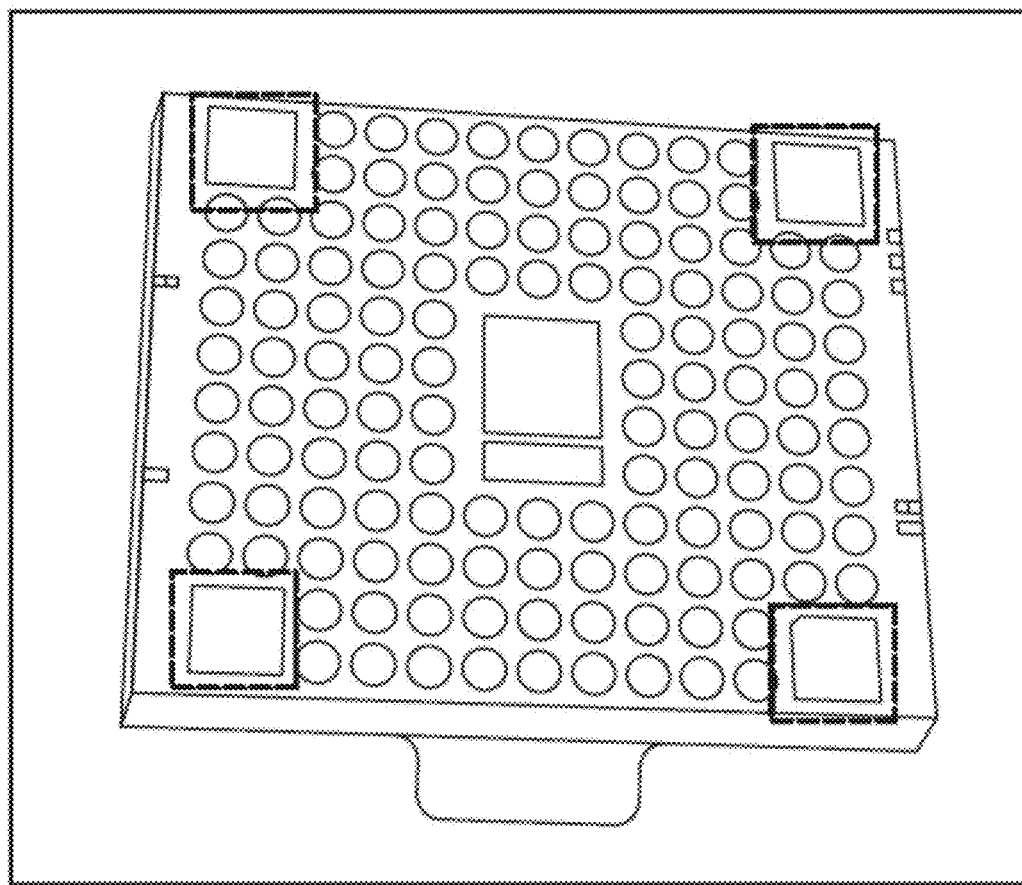
Figure 3:
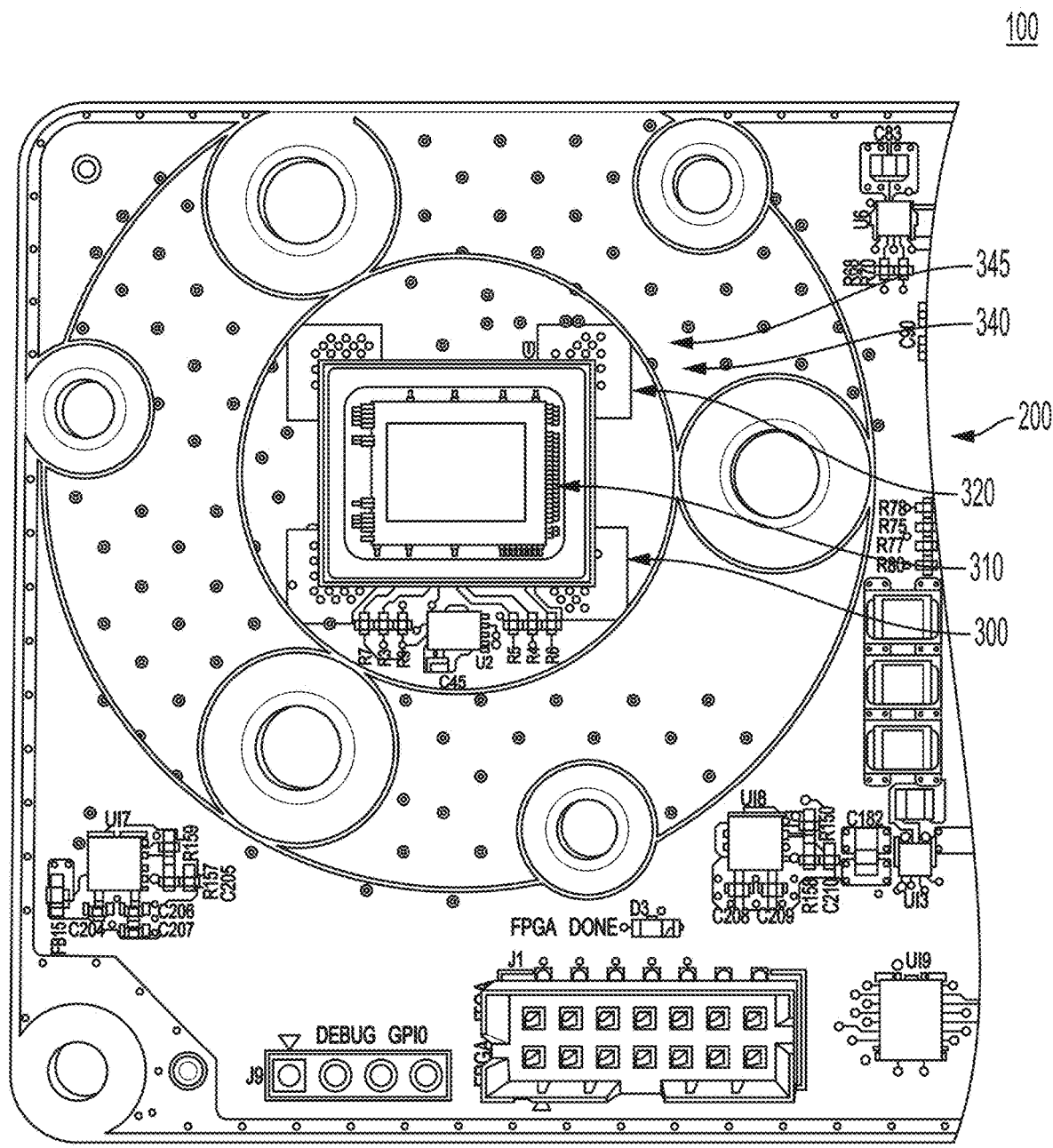
FIG. 3 is a top view of an image sensor assembly having an image sensor and a camera board fab and having thermal pads with thermal vias coupling them, according to an embodiment of the subject invention.

Example One: An Electronic Component Assembly Having Thermal Pads with Thermal Vias Coupling an Image Sensor and a Camera Board Fab Referring to FIG. 3, an electronic component assembly such as an image sensor assembly 100 can comprise an image sensor 300 comprising an image sensor pixel array 310 and at least one conductive pad 320; and a camera board fab 200 disposed beneath the image sensor 300 and coupled to the corner or other non-electrically-functional pads of the image sensor 300 and comprising at least one thermal pad 340 disposed on a top surface of the camera board fab 200. The at least one thermal pad 340 extends under the image sensor 300 and is attached directly to the at least one conductive pad 320 as shown in FIG. 3 and in FIG. 5.

The image sensor pixel array 310 is disposed on a top surface of the image sensor 300 and can be a CCD, a CMOS, an organic image sensor, or other such image sensor. The at least one conductive pad 320 is disposed on at least one corner area of the top surface of the image sensor 300 and is coupled to the at least one thermal pad 340 which can thereby cool the image sensor pixel array 310 to maintain the image sensor pixel array 310 within an operating temperature range.

In certain embodiments, the thermal pad 340 can be arranged to be placed on a top surface of the camera board fab 200 and extended along the edges of the lateral surfaces or the other surfaces of the corner areas of the image sensor 300 to draw thermal energy from the image sensor pixel array 310 toward a heat sink (not shown) that disperses the thermal energy or re-route the thermal energy to another element of the image sensor assembly 100. One advantage provided by such arrangement is that the thermal pad 340 extends the heat removal path beyond the image sensor 300.

In one embodiment, the thermal pad 340 can be formed with a plurality of first thermal vias 345 penetrating through the thermal pad 340 and through the camera board fab 200 to the bottom surface of the camera board fab 200 for transferring heat. A thermal via is a thermally conductive conduit through which heat is conducted. At least one of the plurality of first thermal vias 345 preferably has a shape of a cylinder and is preferably made of metal such as copper (Cu) or copper alloy. Moreover, the at least one of the plurality of first thermal vias 345 can be hollow or be filled with a thermally conductive material.

Moreover, instead of having a finger of Cu going up through a through-hole in the camera board fab 200 and touching the bottom surface of the image sensor 300, the plurality of first thermal vias 345 can be disposed directly under the conductive pad 320 of the image sensor 300 with or without solder paste on the top surface of the camera board fab 200 via stencil, according to an embodiment of the subject invention. The plurality of first thermal vias 345 can be filled with a thermal conductive material, sanded flat and plated. The solder paste if present can be put on a top surface of the plurality of first thermal vias 345 such that when the solder paste melts, the solder paste makes direct contact with the bottom surface of the image sensor 300.

The dark current can be reduced with such arrangement on an order of half in comparison with a conventional image sensor assembly.

In one embodiment, the at least one conductive pad 320 can be thermally or electrically connected with each other. The at least one conductive pad 320 may comprise a signal pad for transmitting or receiving signals for the operations of the image sensor pixel array 310.

Figure 4:
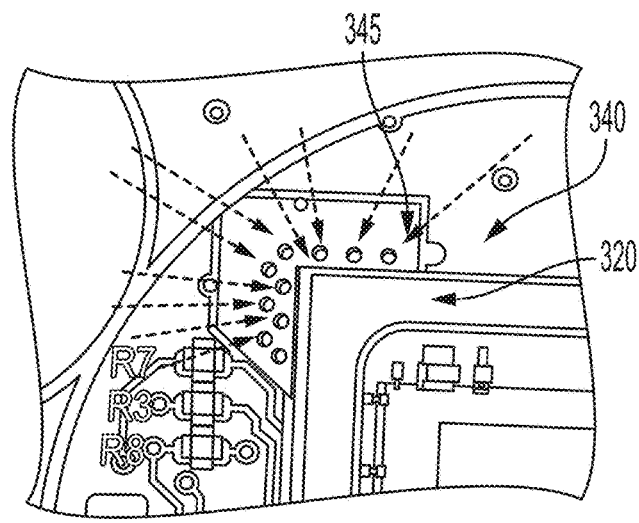
FIG. 4 is a close-up view of one of the thermal pads of FIG. 3, illustrating the thermal pad with the thermal vias coupling the image sensor and the camera board fab, according to an embodiment of the subject invention.

FIG. 4 is a close-up view of one of the thermal pads 340 of FIG. 3 with the plurality of thermal vias 345 and coupling the image sensor 300 and the camera board fab 200, according to an embodiment of the subject invention.

Figure 5:
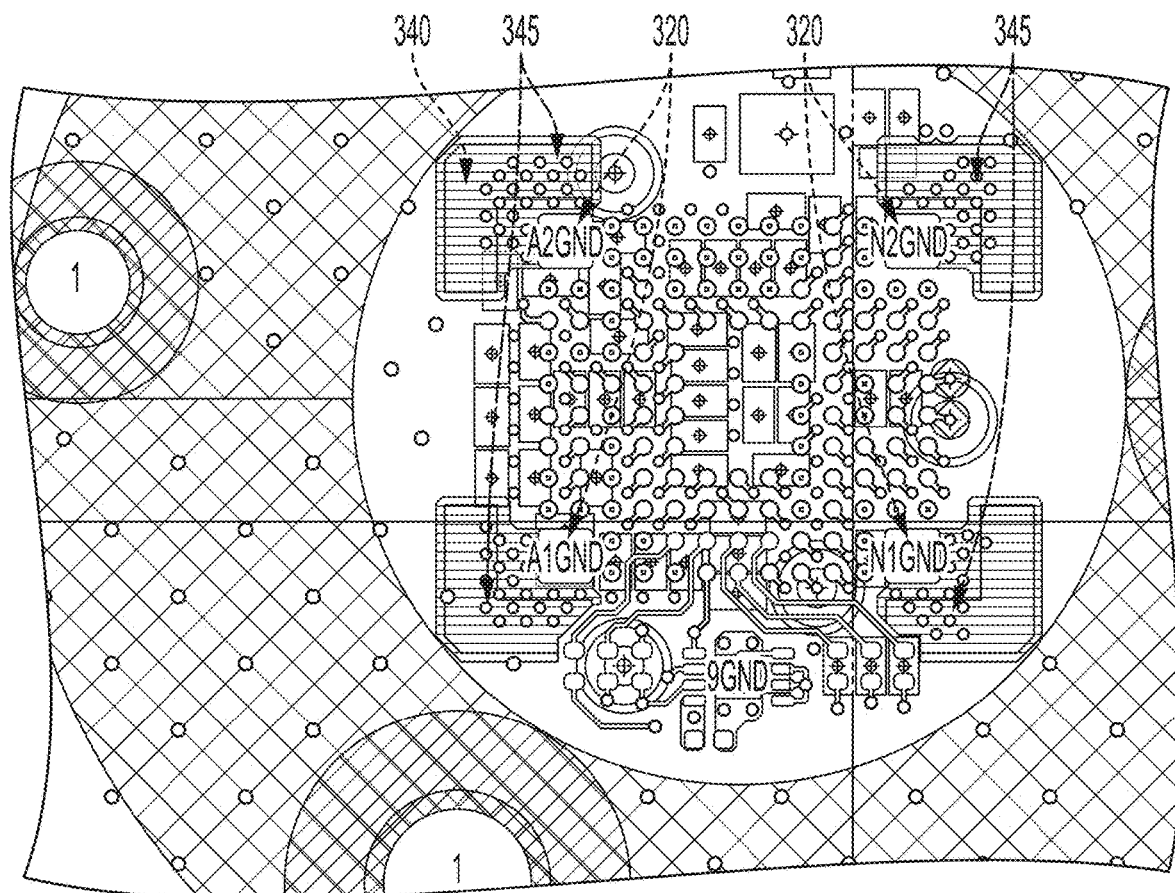
FIG. 5 is a schematic view of the image sensor assembly shown in FIG. 3, showing where the thermal vias are relative to the corner pads on the image sensor, according to an embodiment of the subject invention.

FIG. 5 is a schematic view of the image sensor assembly 100 of FIG. 3 according to an embodiment of the subject invention. The at least one thermal pad 340 is disposed on a surface of the camera board fab 200, extending under the image sensor 300 and attached directly to the at least one conductive pad 320.

Figure 6:
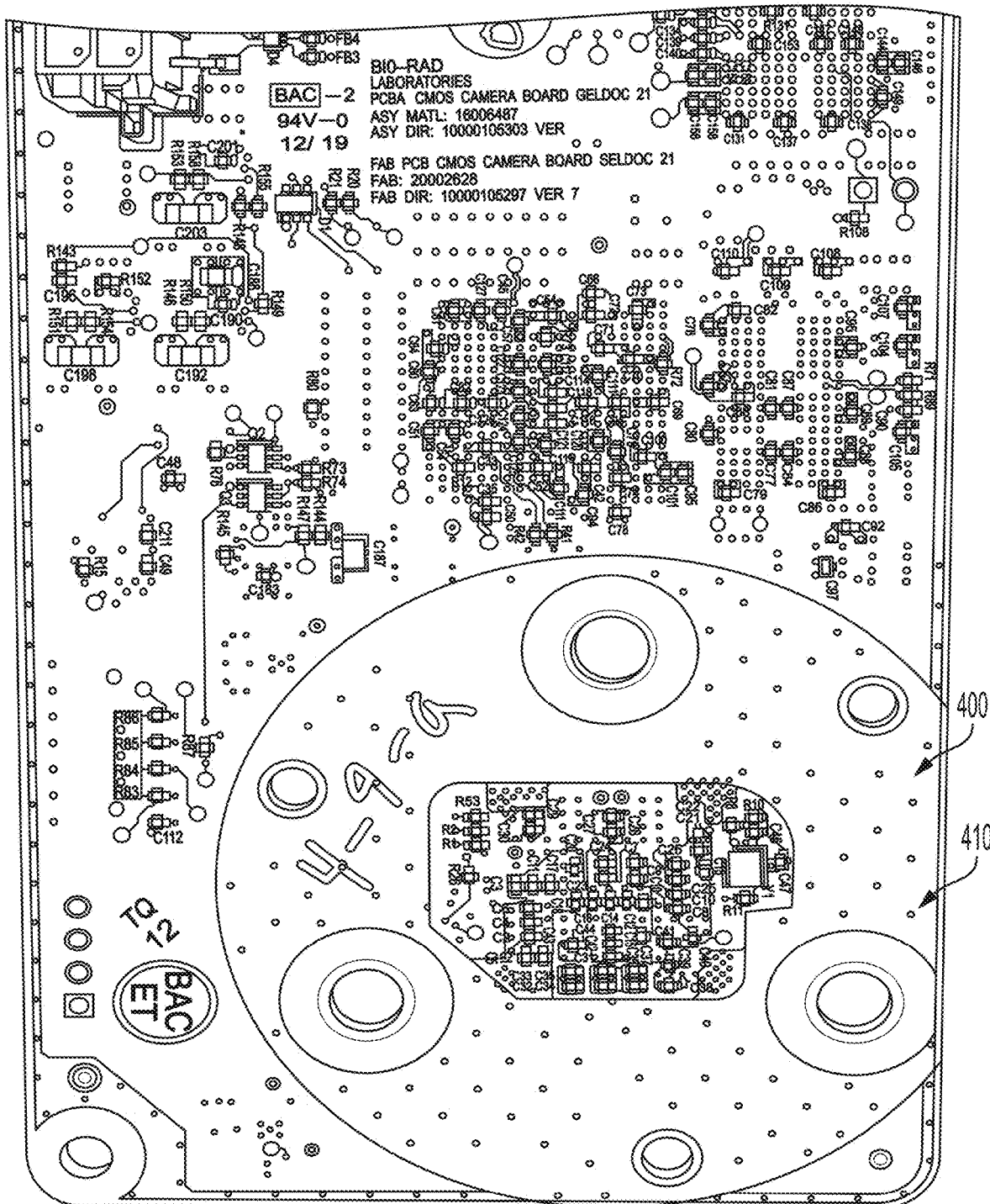
FIGS. 6 and 7 are views of a back side of a prototype of the image sensor assembly, wherein the four corner areas are visible in light green color and red lines outlines the outer and inner boundaries of a thermally conductive layer on the back side of the circuit board, according to an embodiment of the subject invention.
Figure 7:
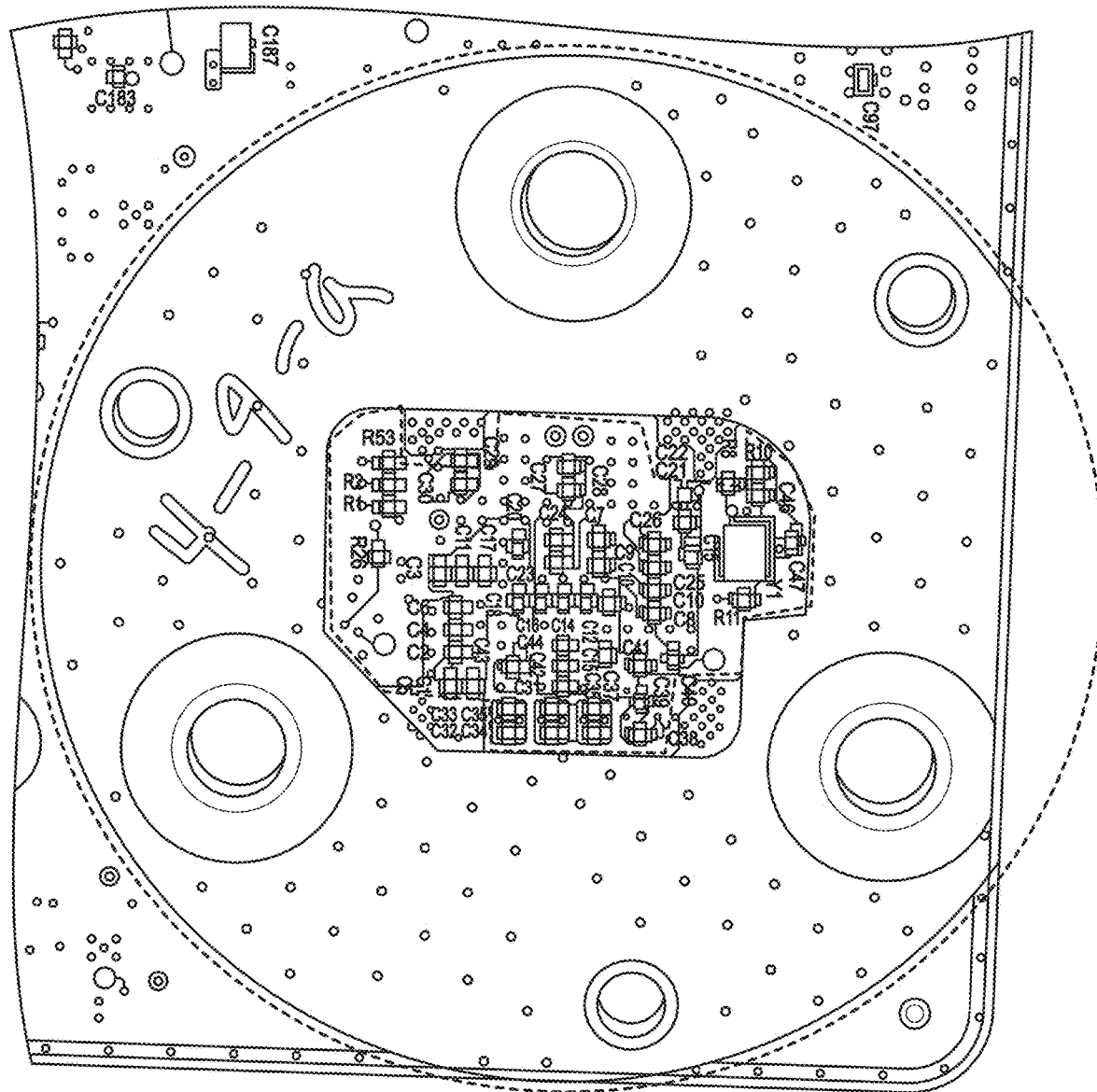

FIGS. 6 and 7 are views of a back side of a prototype of the image sensor assembly 100, wherein the four corner areas are visible in light green color and red lines outlines the outer and inner boundaries of the copper plane on the back side of the circuit board, according to an embodiment of the subject invention.

As illustrated in FIG. 6, the camera board fab 200 can comprise a thermally conductive layer 400 on a bottom surface or a top surface or both surfaces of the camera board fab 200. The thermally conductive layer 400 can be made of metal preferably in a form of copper (Cu) or copper alloy and preferably have a circular or annular shape. The thermally conductive layer 400 can be formed with a plurality of second thermal vias 410 spaced in the thermally conductive layer 400 and penetrating the thermally conductive layer 400 to increase transfer heat from the front surface and any connected planes inside the camera board fab 200 to the rear surface of the camera board fab 200. The thermally conductive layer 400 is indicated by the area between the outer red circle and the inner shape in red of FIG. 7. The four corner pads with the plurality of vias may have an adhesive such as epoxy on them.

In one embodiment, the thermally conductive layer 400 intersects with both the first thermal vias 345 as well as the second thermal vias 410 shown in FIG. 7, allowing the heat to be laterally dispersed better than it would be with only thermally conductive layers 400 on the top and bottom surfaces of the camera board fab 200. The thermally conductive layer 400 may have a thickness of, for example, 35 µm.

In one embodiment, the thermally conductive layer 400 can be arranged to include a laminated structure having a plurality of thermally conductive layers.

Figure 8:
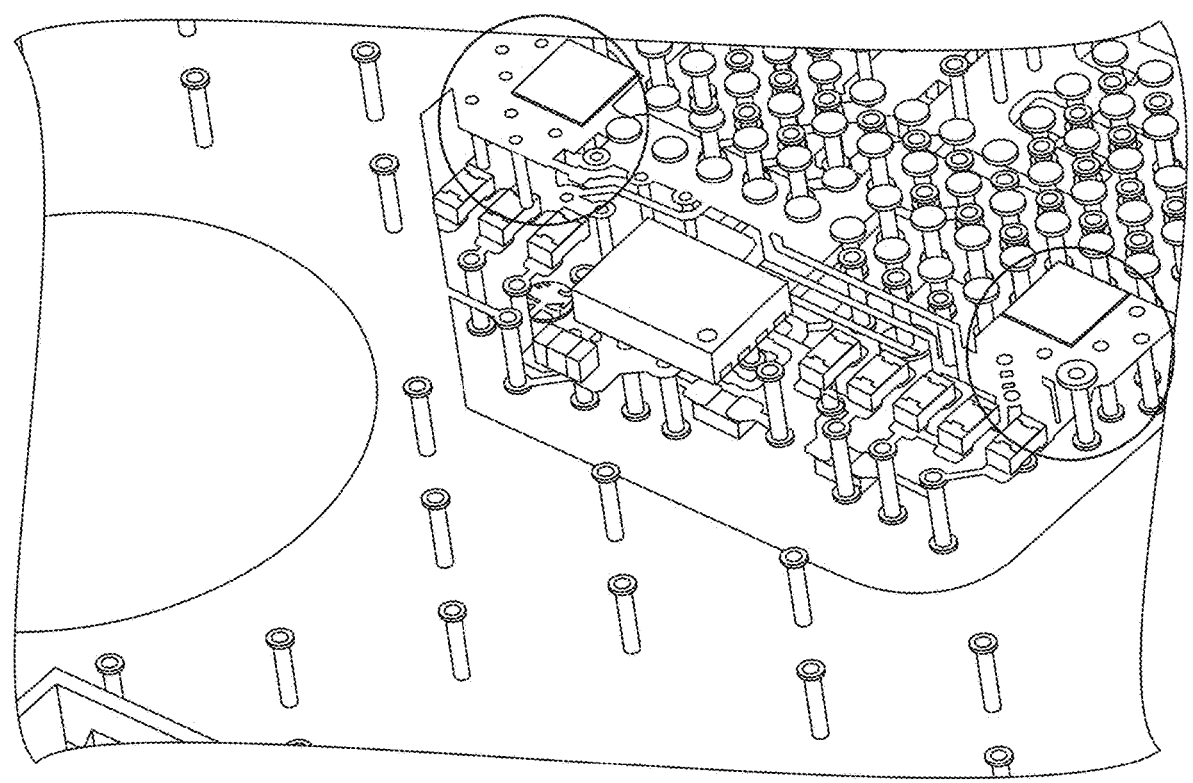
FIG. 8 is a three-dimensional magnified schematic of the image sensor assembly representation (with the thickness dimension is expanded 10 times for viewing), illustrating the thermal pads with the thermal vias coupling the image sensor and the camera board fab, according to an embodiment of the subject invention.

FIG. 8 is a three-dimensional magnified schematic representation (with the thickness dimension is expanded 10 times for viewing) of the image sensor assembly 100, illustrating the thermal pads 340 with the thermal vias 345 coupling the image sensor 300 and the camera board fab 200 through the at least one conductive pad 320 indicated by the area in the red circles in FIG. 8, according to an embodiment of the subject invention.

Figure 9:
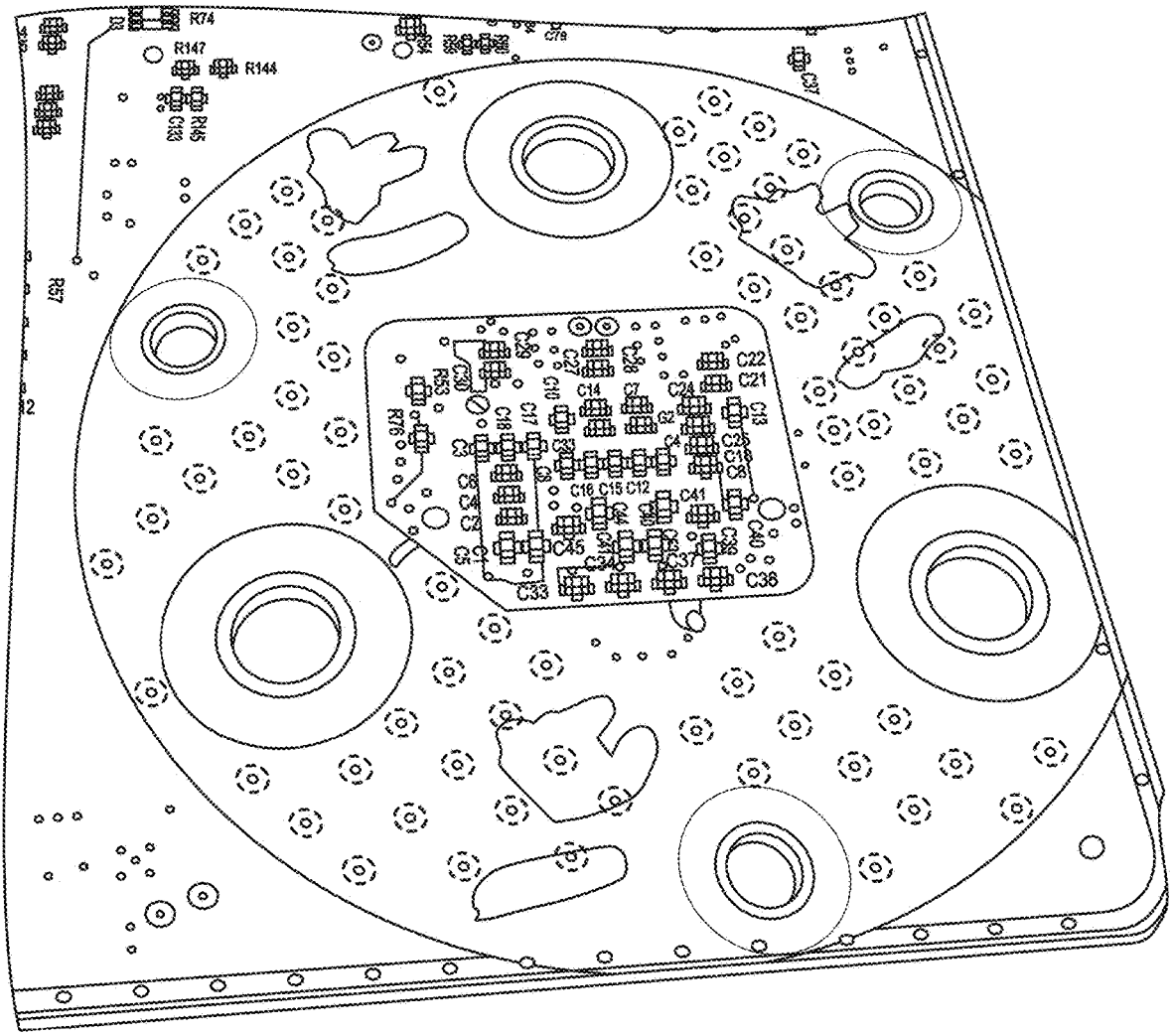
FIG. 9 is a perspective view of the image sensor assembly having the thermally conductive layer on a bottom surface of the camera board fab 200 according to an embodiment of the subject invention.

FIG. 9 is a perspective view of the image sensor assembly 100 having the thermally conductive layer 400 on a bottom surface of the camera board fab 200, according to an embodiment of the subject invention.

Figure 10A:
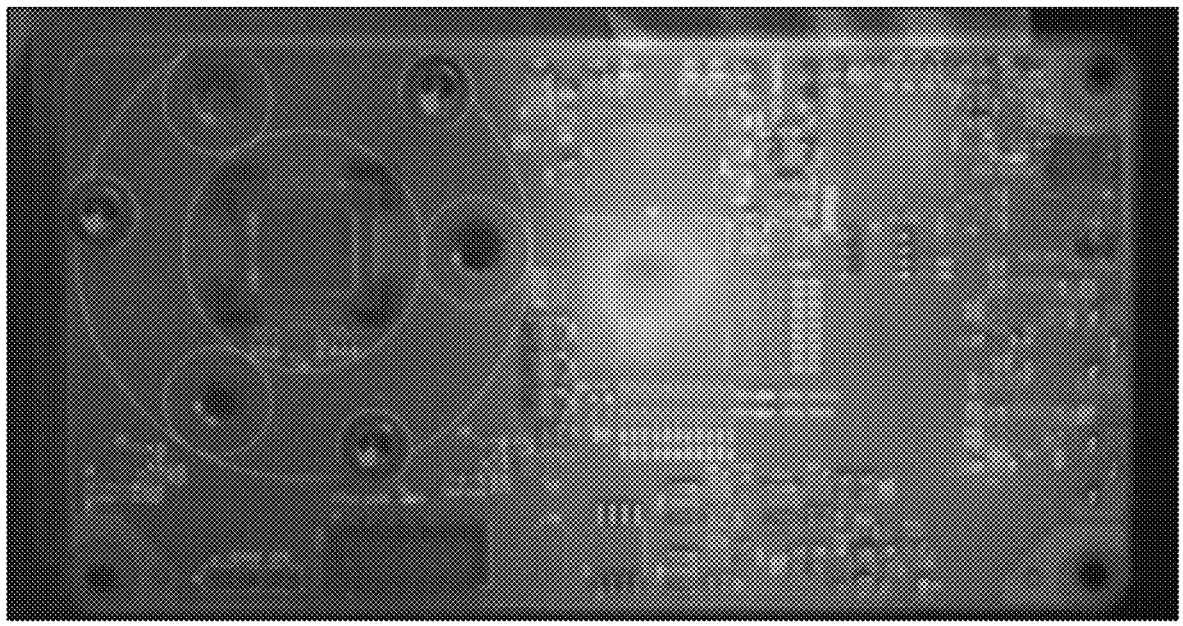
FIGS. 10(a)-(c) are combined mode visible light and 8-14 μm mid-infrared (MIR) images of the image sensor assembly and FIGS. 10(d)-(e) are corresponding temperature profiles of the image sensor assembly; according to an embodiment of the subject invention.
Figure 10B:
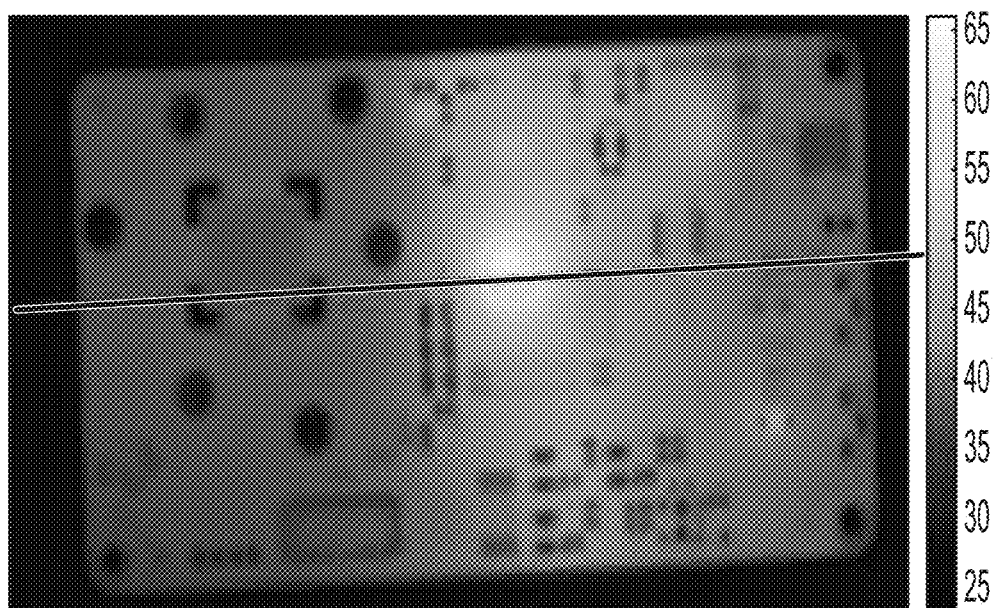
Figure 10C:
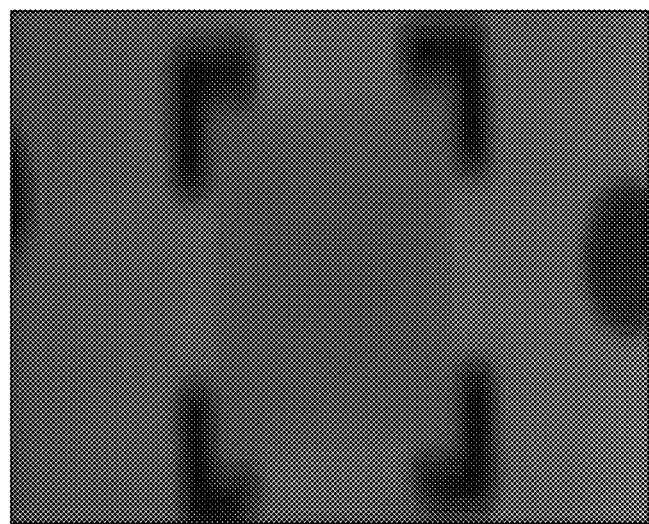
Figure 10D:
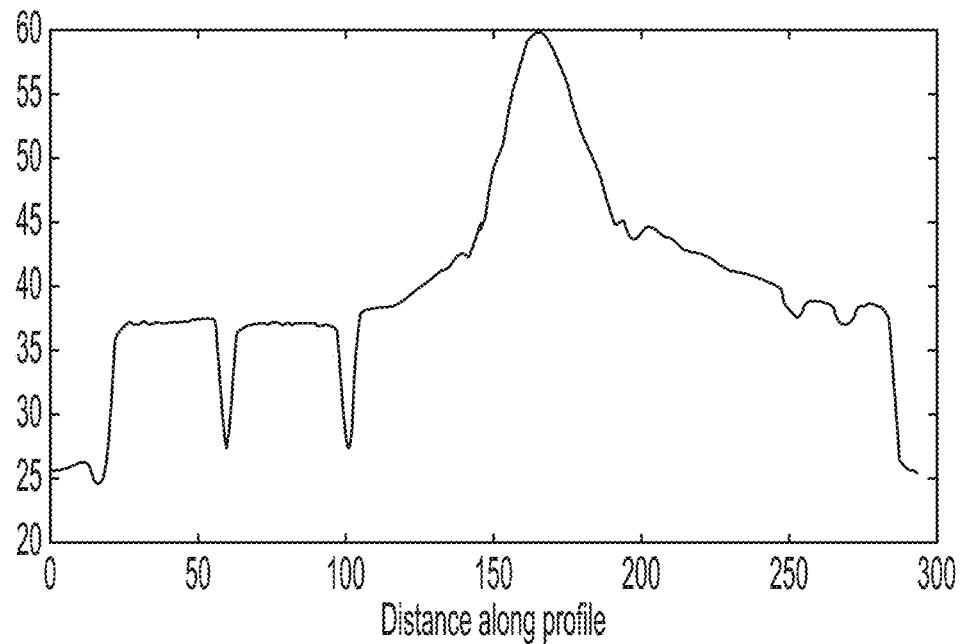
Figure 10E:
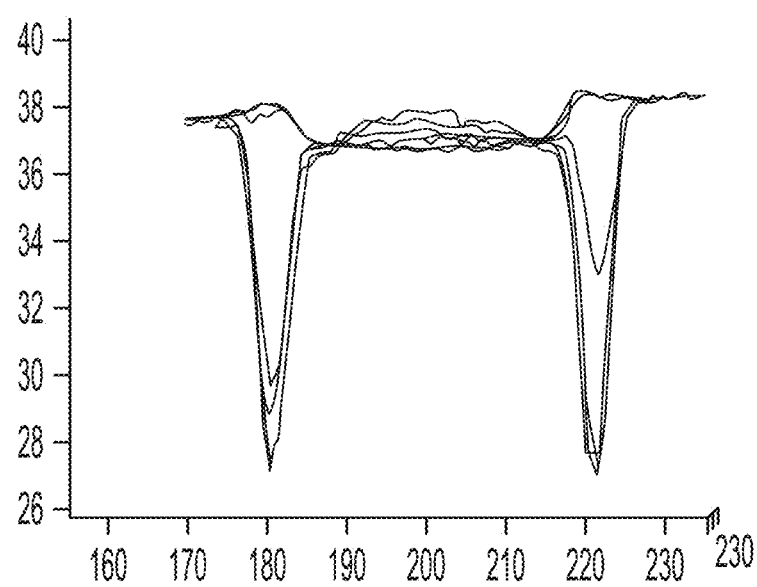

Referring to FIGS. 10(a)-(c), combined mode visible light and 8-14 µm mid-infrared (MIR) microscopy images are taken for the image sensor assembly 100 and FIGS. 10(d)-(e) illustrate corresponding temperature profiles of the image sensor assembly 100 derived from FIGS. 10(a)-(c). The horizontal line in FIG. 10(b) is where the temperature profile is drawn. It is noted that the image sensor 300 is a slightly darker rectangle in the middle of the four corner thermal pads 340. When the thermally conductive layer 400 is attached to the back side of the image sensor 300 through solder connections between the at least one conductive pad 320 and the thermal pad 340 to allow passive heat sinking, the at least one corner thermal pads 340 is dramatically cooler and the image sensor 300 is colder than the camera board fab 200.

Figure 11:
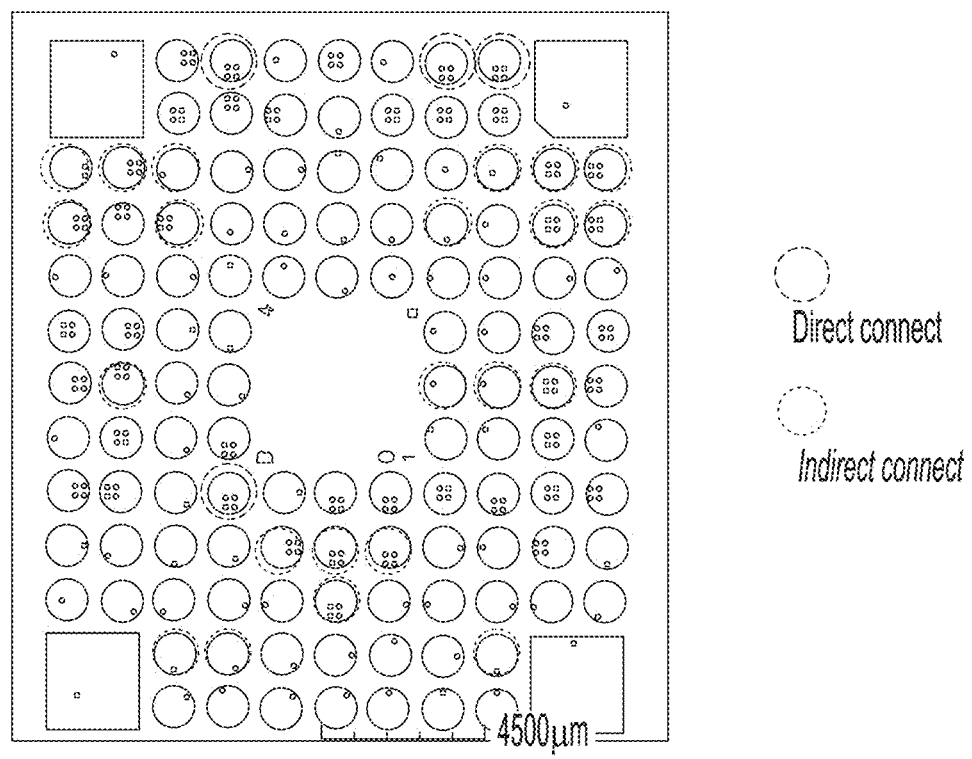
FIG. 11 illustrates the image sensor comprising a plurality of signal pads according to an embodiment of the subject invention.

As illustrated in FIG. 11, the image sensor 300 can further comprise a plurality of signal pads that transmits or receives signals and the signal pads can be thermally connected to the camera board fab 200 to dissipate heat to maintain a controlled temperature for the operations of the image sensor. If the signal pads are grounded ones, they can connect through electrically conductive material such as vias or planes to the back side of the camera board fab 200. The red circles are ones representing where there is a connection inside the image sensor 300 from the pad to the pixel plane. The blue ones go through internal circuitry inside the part.

To additionally improve the thermal dissipation efficiency, the image sensor assembly 100 can further comprise a cooling structure coupled to the camera board fab 200. The cooling structure may comprise at least one cold finger or other forms of thermal extension component/s that is dimensioned to protrude through a through-hole of the camera board fab 200 so as to contact a surface of the image sensor 300 for heat transfer, as shown in FIGS. 12 and 13.

Figure 15:
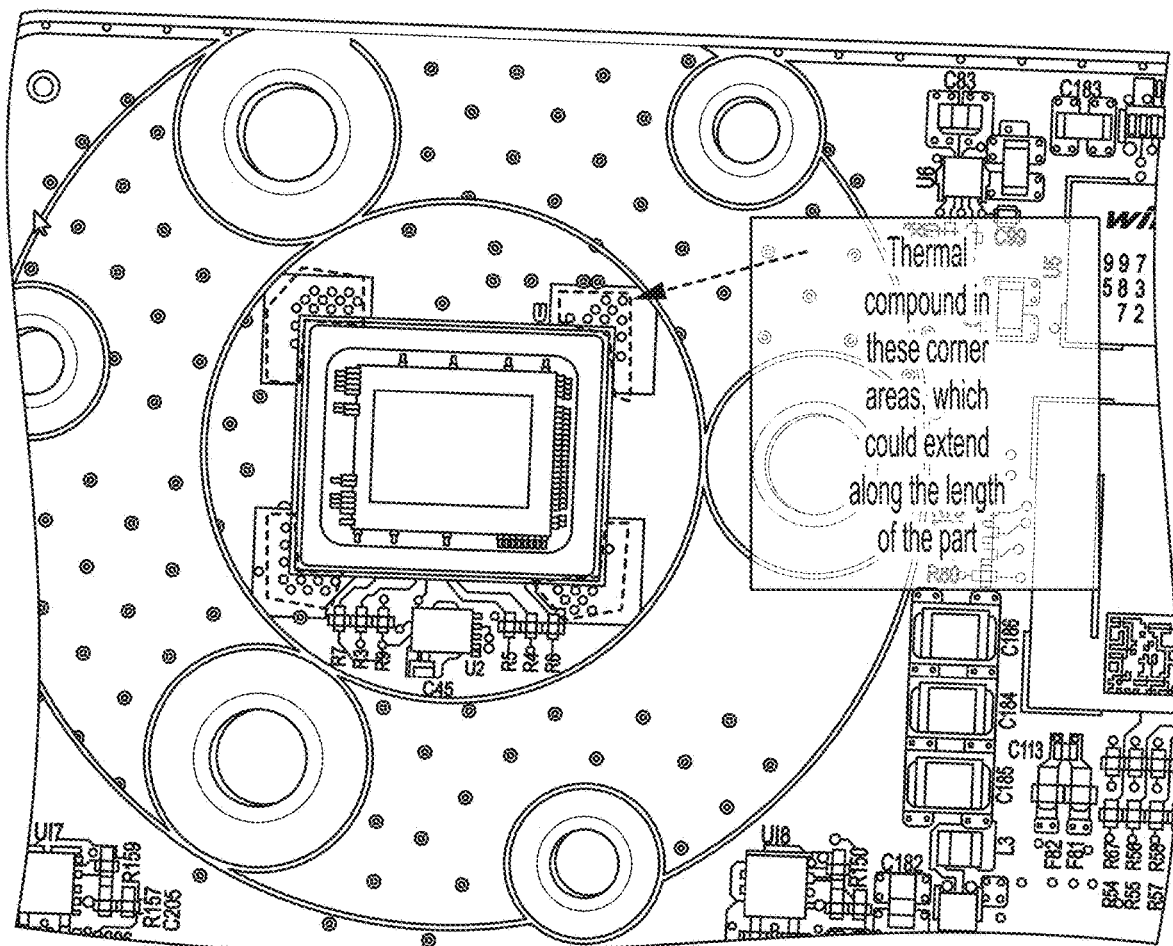
FIG. 15 is a schematic view of the image sensor assembly in which thermal compound material may be applied between corner areas of the image sensor and the corner areas of the thermal pad comprising the thermal vias and extending along lengths of the thermal pad, according to an embodiment of the subject invention.

In one embodiment, as illustrated in FIG. 15, the image sensor assembly 100 can further comprise a thermal compound material that may be disposed between corner areas of the thermal pad 340 and the corner areas of the image sensor 300 and extending along lengths of the thermal pad 340 for thermal conduction.

Moreover, instead of having a finger of Cu going up through a through-hole in the camera board fab 200 and touching the bottom surface of the image sensor 300, the image sensor assembly 100 can further comprise a third plurality of thermal vias disposed directly under the image sensor 300 with or without solder paste on the top surface of the camera board fab 200 via stencil, according to an embodiment of the subject invention. The third plurality of thermal vias can be filled with a thermal conductive material, sanded flat and plated. The solder paste if present can be put on a top surface of the third plurality of thermal vias such that when the solder paste melts, the solder paste makes direct contact with the bottom surface of the image sensor 300.

Figure 12A:
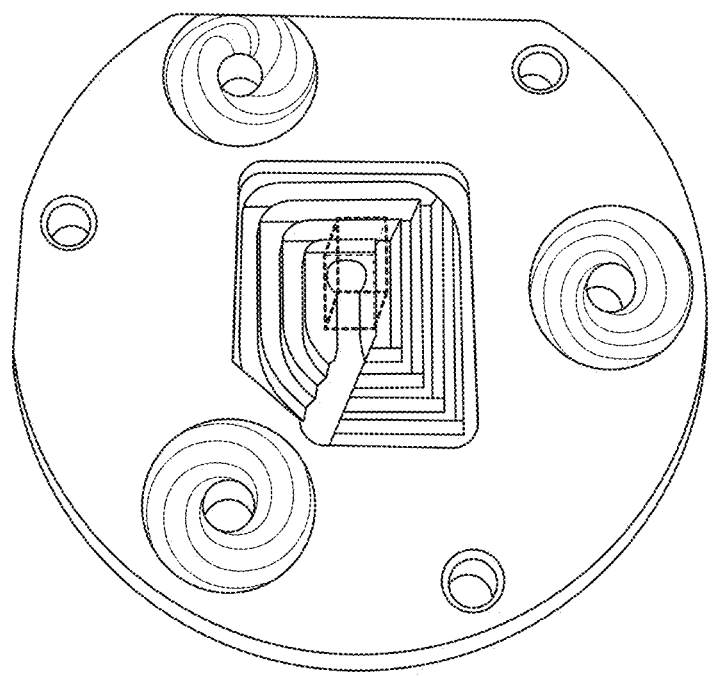
FIGS. 12(a) and 12(b) are top views of the image sensor assembly showing the copper heat sink plate with the green lines indicating a cold finger in FIG. 12(a), according to an embodiment of the subject invention.
Figure 12B:
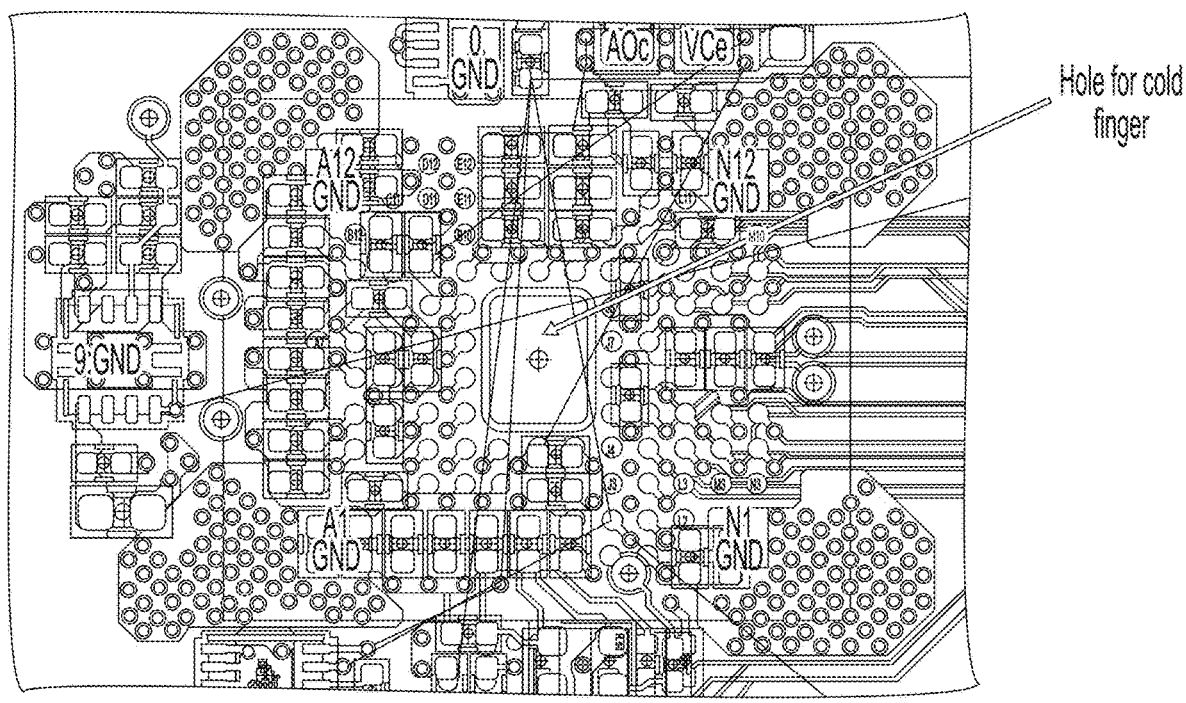
Figure 13:
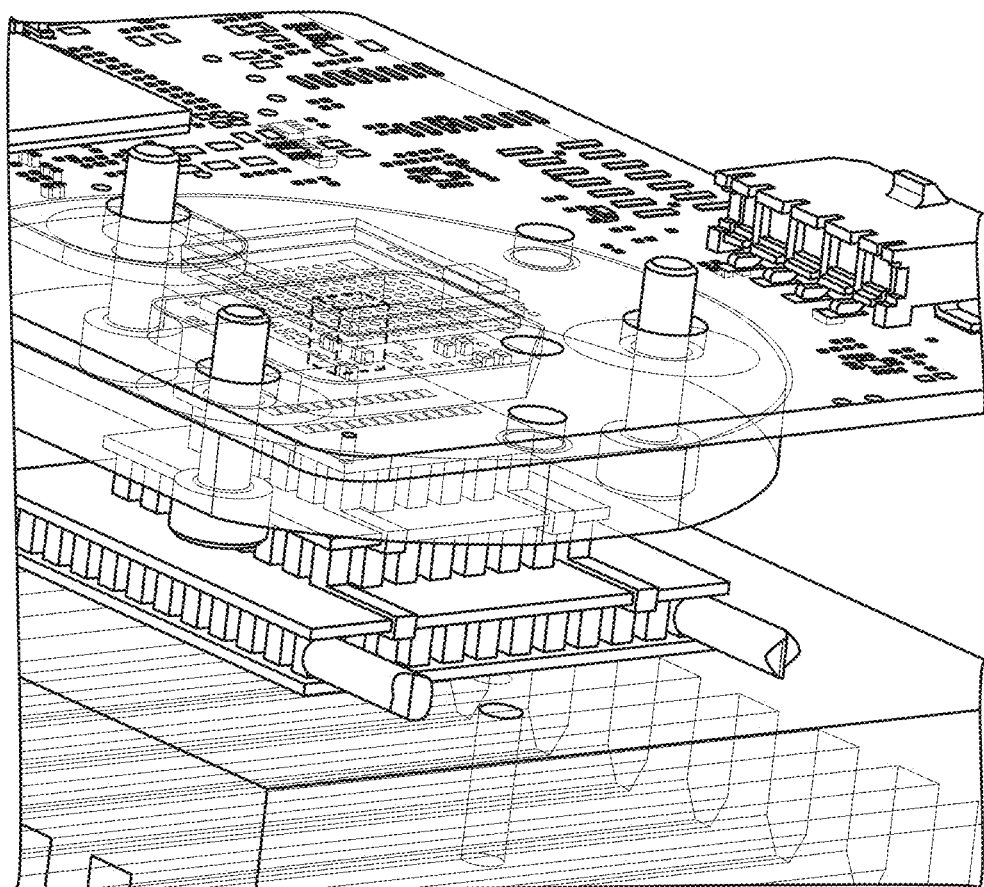
FIG. 13 is schematic view of the image sensor assembly comprising a cooling structure protruding through a through-hole of the camera board fab so as to contact a surface of the image sensor for heat transfer, according to an embodiment of the subject invention.
Figure 14A:
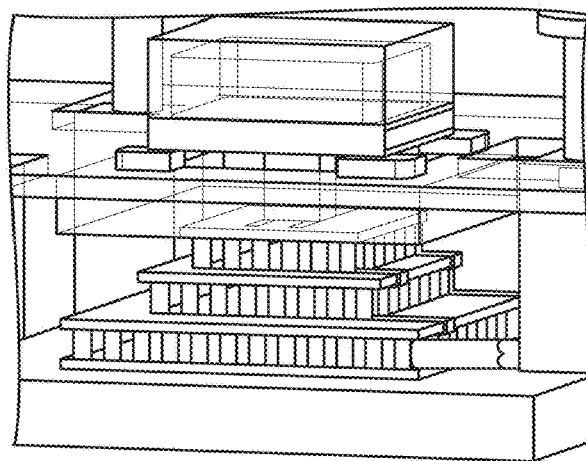
FIGS. 14(a)-(d) are schematic views of the image sensor assemblies (a) having both the thermal pad with the thermal vias arrangement and the cold fingers, (b) having only the thermal pad with the thermal vias arrangement, (c) having only the cold fingers, and (d) having no thermal pad with thermal vias arrangement nor cold fingers, respectively, according to an embodiment of the subject invention.
Figure 14B:
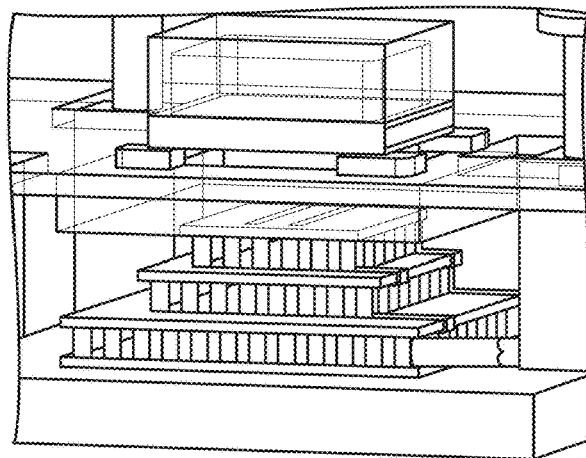
Figure 14C:
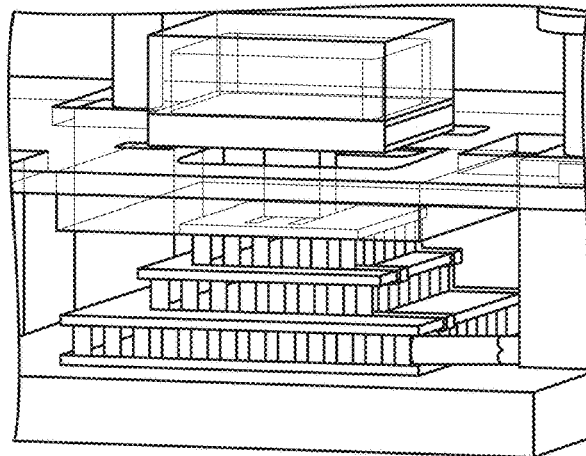
Figure 14D:
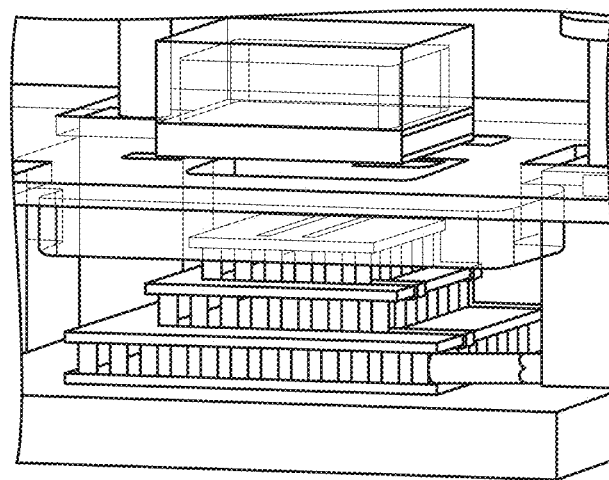
Figure 33:
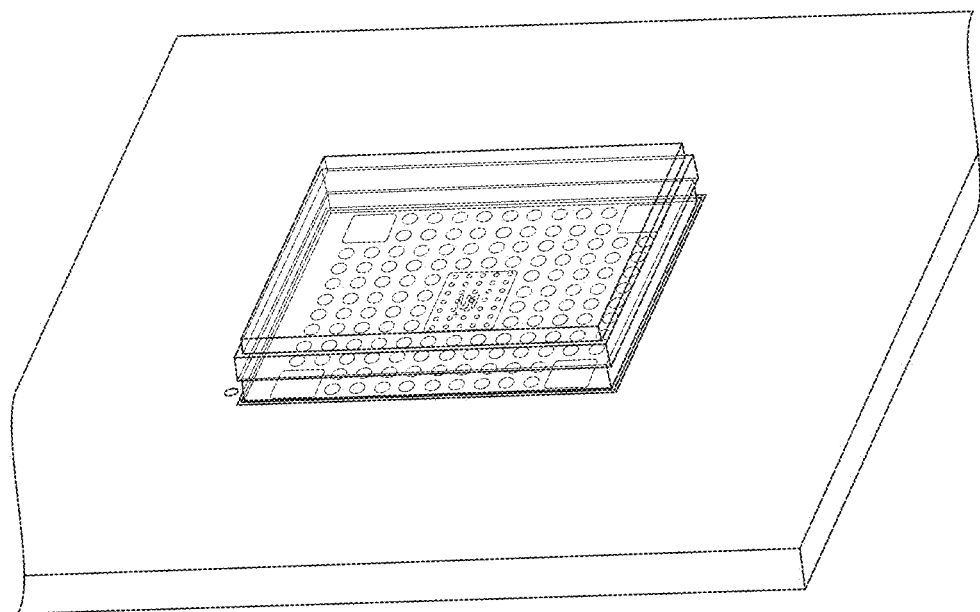
FIG. 33 is an isometric view of the image sensor assembly from a top side, showing a plated surface under which the filled thermal vias are disposed, according to an embodiment of the subject invention.

FIGS. 12(a) and 12(b) are top views of the image sensor assembly showing the copper heat sink plate with the green lines indicating a cold finger in FIG. 12(a), according to an embodiment of the subject invention. In comparison, FIG. 33 is an isometric view of the image sensor assembly from a top side, showing a plated surface under which the filled thermal vias are disposed, according to an embodiment of the subject invention. The blue perimeter in FIG. 33 is the plated surface under which the third plurality of thermal vias is disposed.

Figure 34:
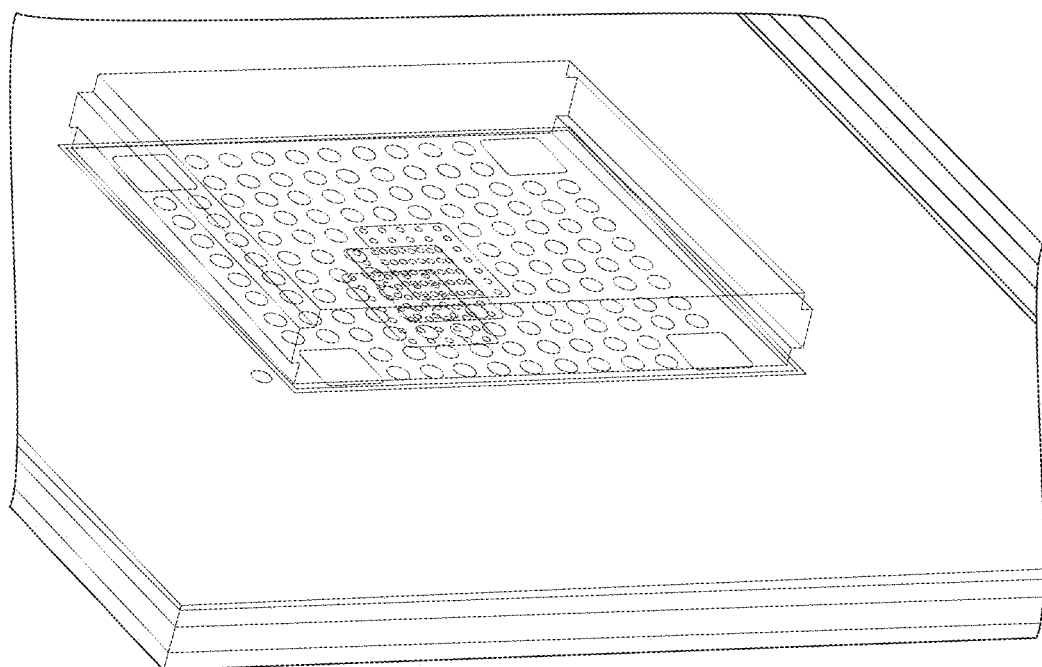
FIG. 34 is a schematic view of the image sensor assembly, showing a plurality of plated surfaces inside the camera board fab, according to an embodiment of the subject invention.

FIG. 34 is a schematic view of the image sensor assembly, showing a plurality of plated surfaces inside the camera board fab 200, according to an embodiment of the subject invention. The filled thermal vias can be disposed on the plurality of plated surfaces inside the camera board fab. The thermal vias terminate at the bottom plated surface (lowest in FIG. 34) and are covered with plating and the intermediate plated surfaces are disposed inside the camera board fab 200. The third plurality of thermal vias is plated on the back side too, providing a flat surface for a Cu or other metal part to touch to conduct the heat out.

Figure 35:
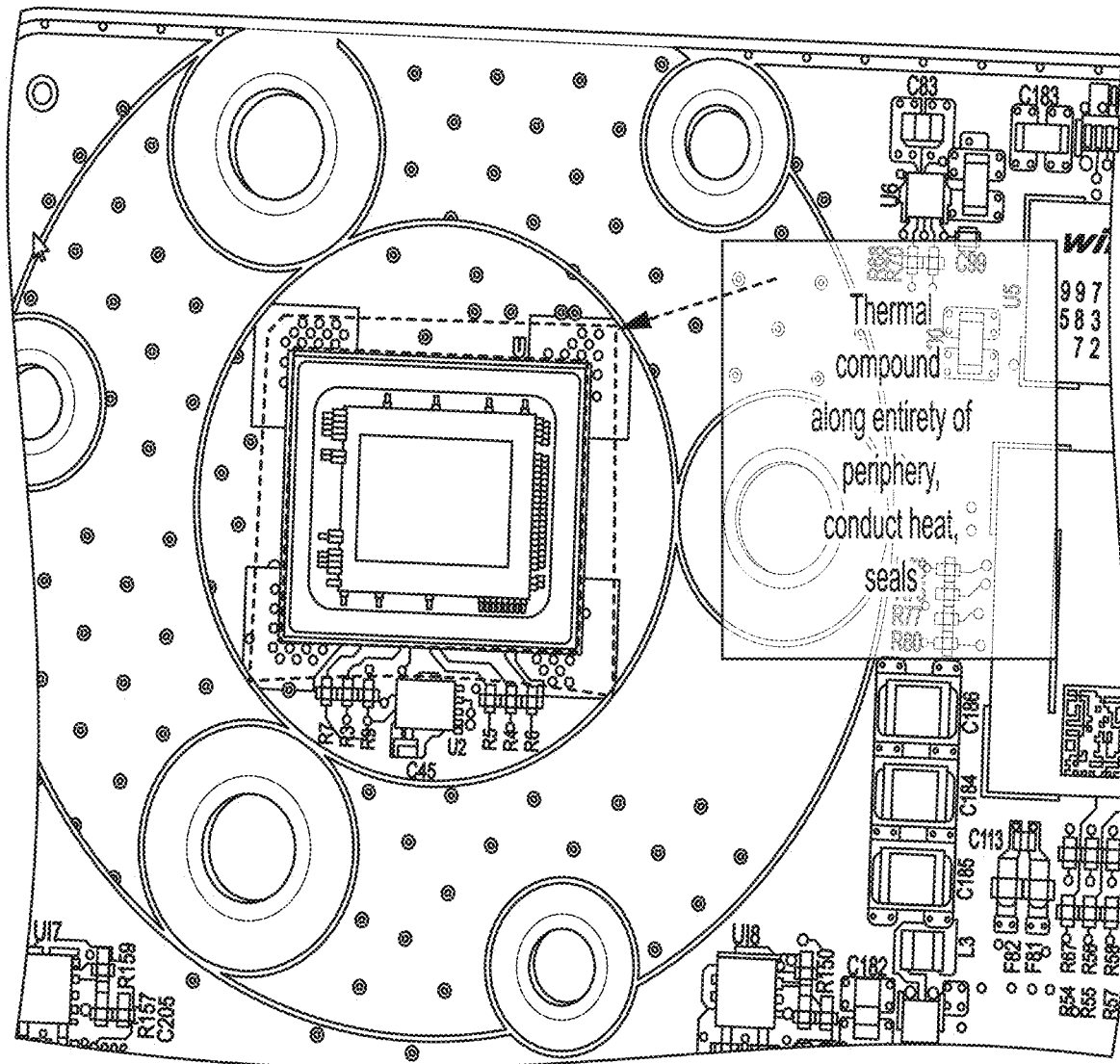
FIG. 35 is a schematic view of the image sensor assembly in which thermal compound material may be applied along entirety of periphery of the image sensor for conducting heat and for sealing, according to an embodiment of the subject invention.

FIG. 35 is a schematic view of the image sensor assembly 100 in which the thermal compound material may be applied along entirety of periphery of the image sensor 300 for conducting the heat and for sealing to inhibit moisture from getting underneath the image sensor 300, according to an embodiment of the subject invention.

In one embodiment, after the camera board fab 200 is made to have a flat surface without any holes, a plurality of holes is drilled on the flat surface of the camera board fab 200 and is cleaned, and then a plurality of via barrels is plated in the plurality of holes, respectively. Next, the via barrels are filled with epoxy and covered with Cu. A sanding operation can be additionally carried out to make the thermal vias all flat. Any thermal vias that are not covered by solder masks are plated.

In one embodiment, the space between the edges of the camera board fab 200 and the image sensor 300 are sealed along the edges. Such sealing together with the sealing around the edges of image sensor 300 on the upper surface of the camera board fab 200 described above seal off the bottom surface of the image sensor 300 where the contacts of the image sensor 300 are disposed, thereby inhibiting shorting.

In another embodiment, instead of sealing all the way around on the edges of upper surface of the camera board fab 200 to the edges of the image sensor 300 and the bottom surface of the camera board fab 200 and the hole to the image sensor 300, an underfill material which flows underneath to inhibit condensation is applied. The underfill material may be, for example, a reworkable underfill encapsulant for a ball grid array (BGA), chip scale packages (CSPs), or wafer-level chip scale packages (WL-CSPs). It is noted that the thermal adhesive may still be applied to the corners of the image sensor 300 or all the way around on the edges of upper surface of the camera board fab 200 for the thermal conduction purpose.

In one embodiment, a conformal coating can be applied in the masked areas for inhibiting condensation-related shorting of the electronic components. In particular, on the upper surface of the camera board fab 200, the conformal coating is applied around the image sensor 300 and extended out to the gasket light seal. More conformal coating may be applied outside the gasket light seal and extended to a location where a thermal testing indicates that the surface temperature of the camera board fab 200 goes below the ambient temperature or where no electronic components are exposed. In addition, if there are electronic components exposed on the bottom surface, the conformal coating can be applied on the bottom surface of the camera board fab 200. Furthermore, if the camera board fab 200 has a flat backed board in direct contact with the TEC, the conformal coating may be applied around the edges of the Cu part where the camera board fab 200 gets cooled. Examples of the conformal coating include but not limited to glob top and dam-and-fill encapsulants.

Figure 16:
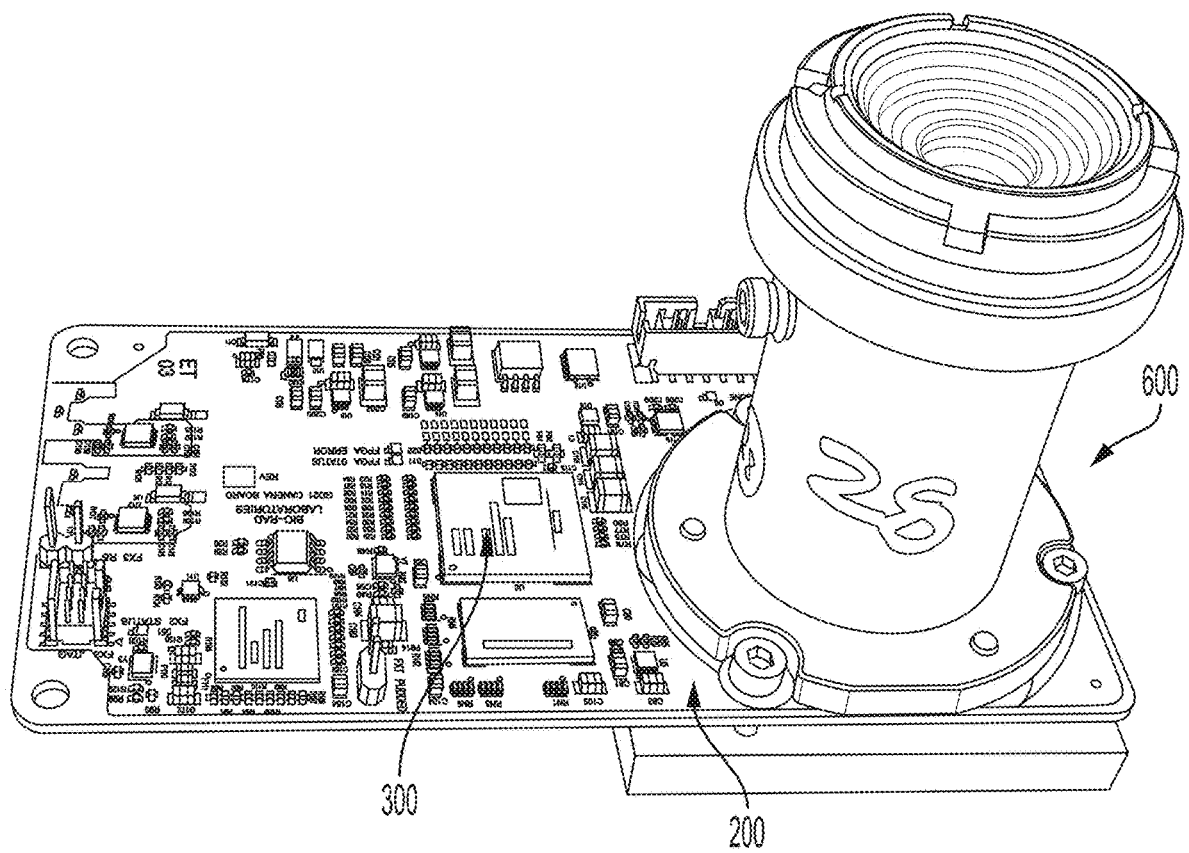
FIG. 16 is a perspective view of the image sensor assembly comprising a lens mount for mounting a lens, the lens mount and an image sensor being horizontally disposed on a same surface of the camera board fab, according to an embodiment of the subject invention.

In one embodiment, for additional thermal performance improvements, the image sensor assembly 100 can further comprise a lens mount 600 for mounting a lens and for acting as a heat sink by placing the lens mount 600 directly onto a top surface of the camera board fab 200. The lens mount 600 and the image sensor 300 are horizontally disposed on a same surface of the camera board fab 200, as shown in FIG. 16.

In case that exact planarity between the lens 600 and the image sensor 300 is not achievable, depending on the method by which the lens 600 and the image sensor 300 are formed or mounted on the camera board fab 200, it is desirable to have sufficient planarity to permit better thermal dissipation.

Dark currents of the image sensor for four different cooling structures are measured and the results of the measurements are summarized in FIG. 36. It is noted that a significantly lower dark current is achieved when the lens is mounted directly onto the camera board fab 200 compared to when it is not mounted directly onto the camera board fab 200.

Moreover, since the lens is directly mounted onto the camera board fab 200, there is no intervening mount and back focus adjustment ring, adding point tolerances, thereby reducing the number of parts between lens 600 and the image sensor 300 by at least two.

Figure 17:
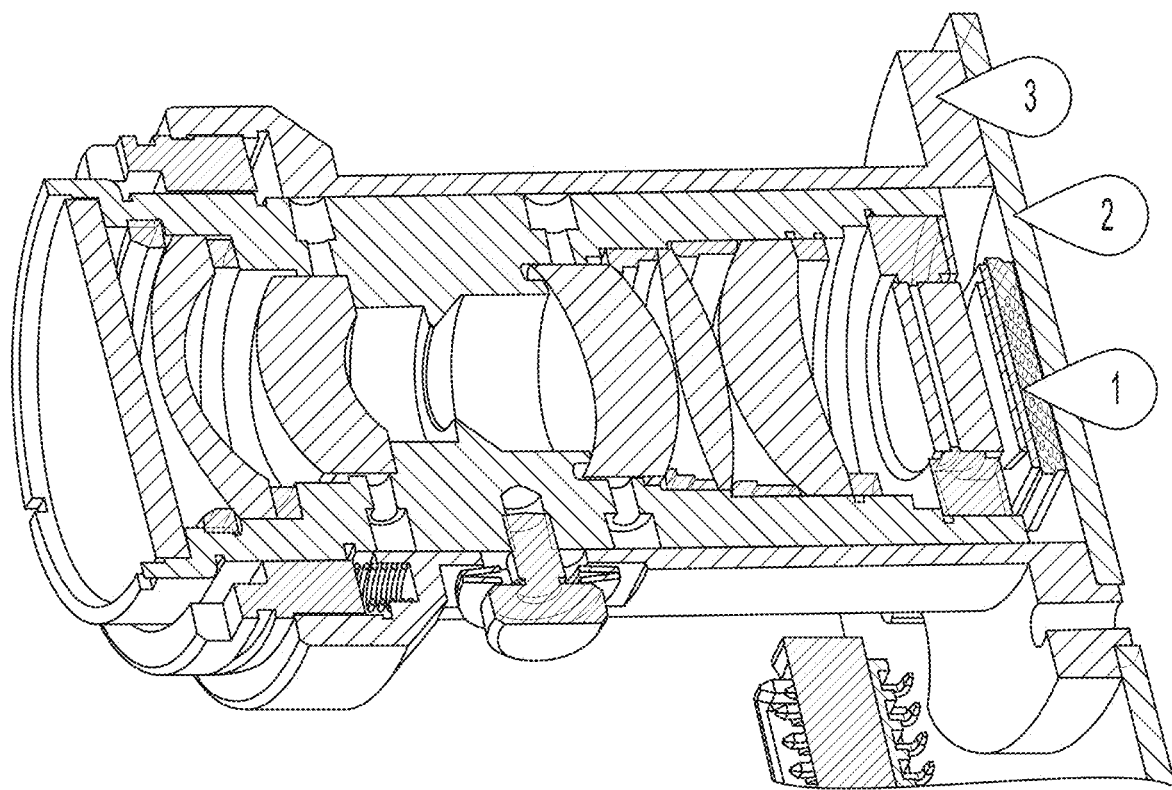
FIG. 17 is a cross-sectional view of the passively cooled image sensor assembly according to an embodiment of the subject invention.

FIG. 17 is a cross-sectional view of the passively cooled image sensor assembly according to an embodiment of the subject invention.

Example Two: An Image Sensor Assembly with Active Cooling by a TEC

Referring to FIGS. 14(a)-(d), four different configurations: (a) the image sensor assembly 100 having both the thermal pads with the thermal vias arrangement and the cold finger, (b) the image sensor assembly 100 having only the thermal pads with thermal vias arrangement, (c) the image sensor assembly 100 having only the cold finger, and (d) having no thermal pads with thermal vias arrangement nor cold finger, respectively, are shown, respectively.

Results of simulations of temperature profiles of these three configurations in comparison with the image sensor assembly 100 having no thermal pads with thermal vias arrangement nor cold finger are summarized in FIG. 37.

It is noted that the image sensor assembly 100 having the thermal pads with thermal vias only and the image sensor assembly 100 having the cold finger only are less effective than the image sensor assembly 100 having both the thermal pads with thermal vias and the cold finger in heat dissipation. The temperature of the image sensor is lowered by about 2° C. when the thermal pads with thermal vias are employed in conjunction with the cold finger. The image sensor assembly having neither thermal pads with thermal vias nor a cold finger is the least effective in heat dissipation among the four configurations by about 22 degrees Celsius.

Figure 18:
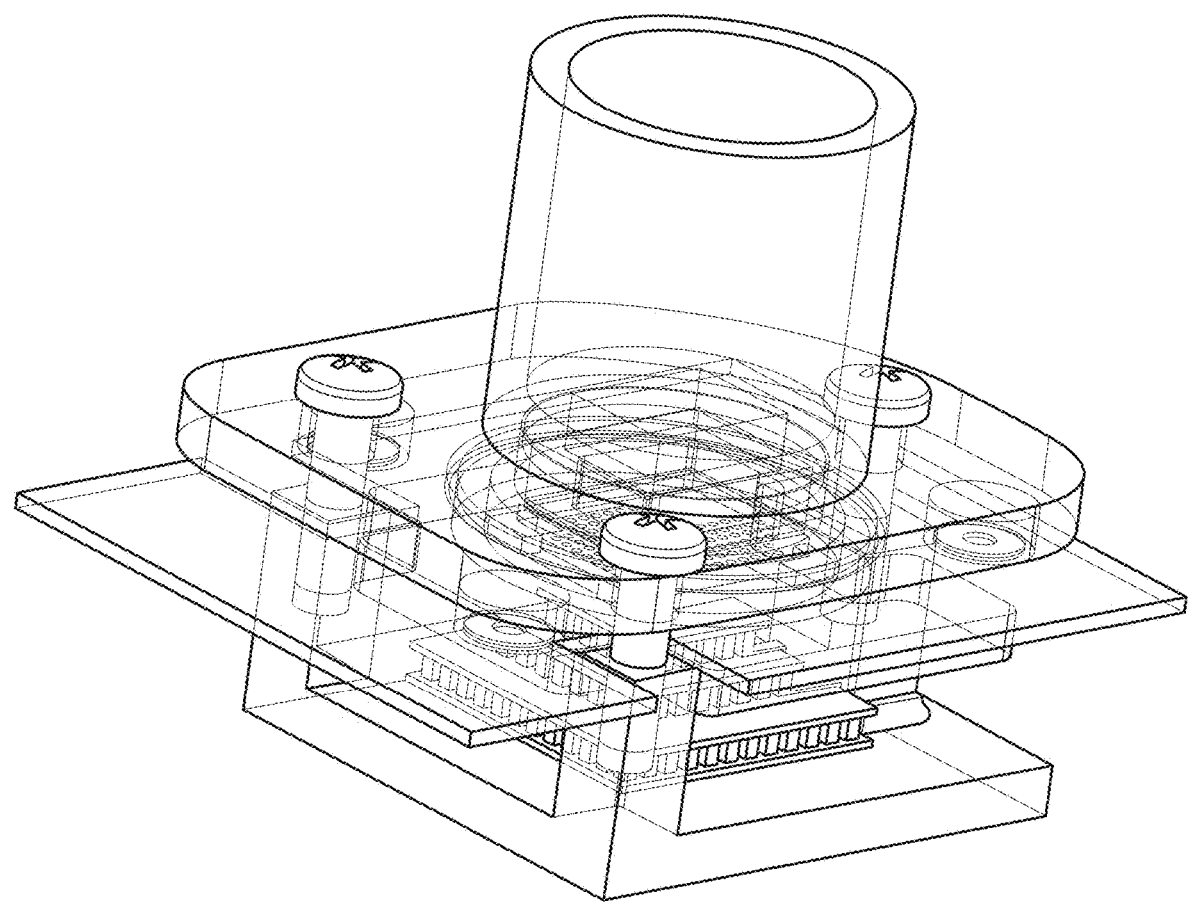
FIG. 18 is a perspective view of the image sensor assembly with active cooling by a thermoelectric cooling element (TEC), according to an embodiment of the subject invention.

Referring to FIG. 18, an image sensor assembly 700 with active cooling by a thermoelectric cooling element (TEC) is illustrated according to an embodiment of the subject invention.

Figure 19:
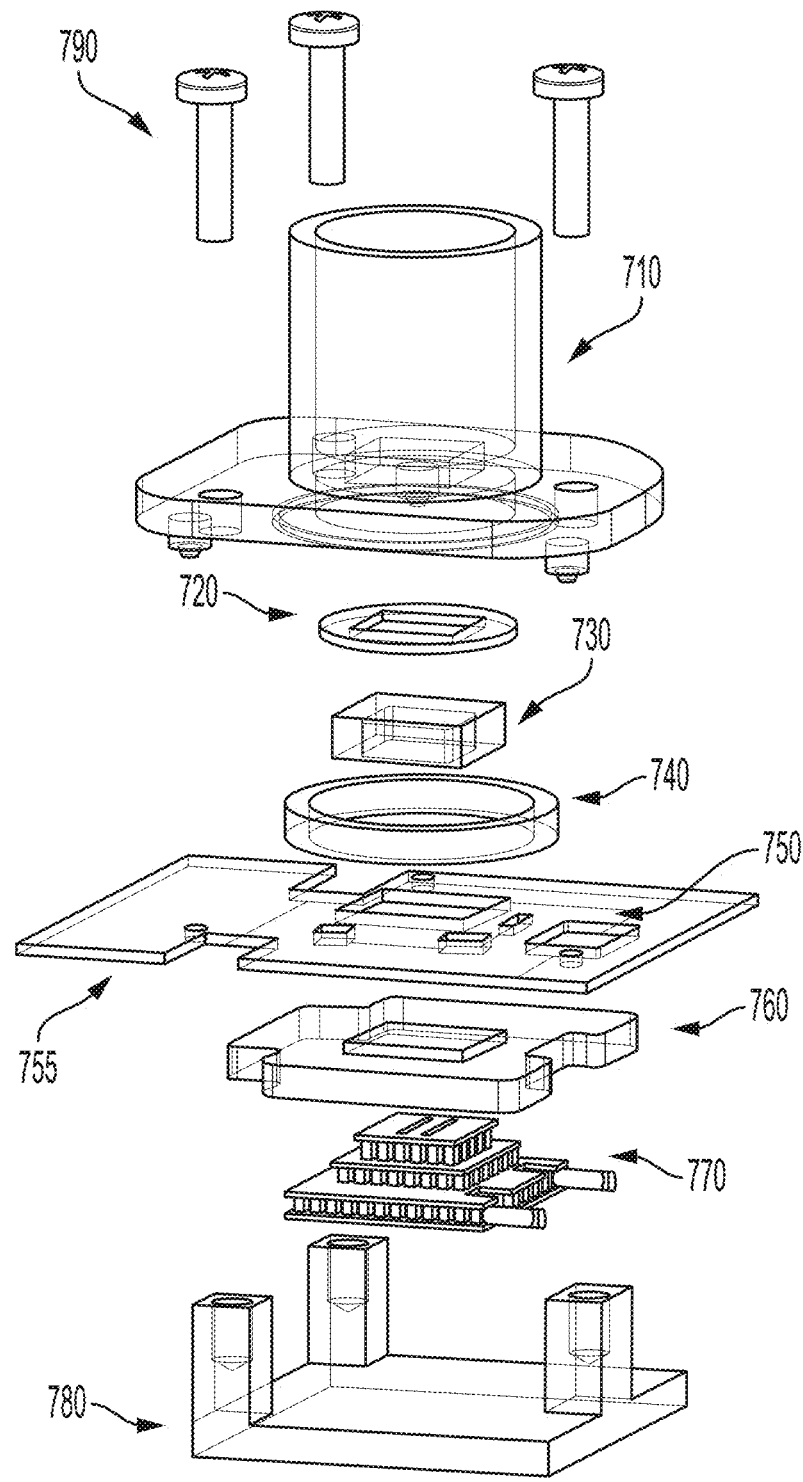
FIG. 19 is an exploded view of the image sensor assembly with active cooling by the thermoelectric cooling element (TEC), according to an embodiment of the subject invention.

Referring to FIG. 19, the image sensor assembly 700 can comprise a lens outer barrel 710, a contact material 720 such as a sil pad, or other thermally conductive, compressible materials such as a graphoil or a direct physical connection, with or without a thermal paste, disposed under the lens outer barrel 710 to conduct heat from the lens outer barrel 710 to a top surface of an image sensor cover 730 that is disposed under the contact material 720, a foam light seal 740 disposed around the image sensor 750 and the image sensor cover 730, a camera board fab 755 on which the image sensor 750 is disposed, the camera board fab 755 disposed under the foam light seal 740, a heat conductor 760 disposed under the camera board fab 755, a single or multi-stage TEC 770 disposed under the heat conductor 760, a heat sink 780 disposed under the TEC 770, and a plurality of fasteners 790 such as screws for coupling the lens outer barrel 710 and a heat sink 780. The screws comprise a metal such as copper for maximizing heat conduction.

In one embodiment, the image sensor cover 730 arranged to protect elements of the image sensor (not shown) can be hollow, bonded to an image sensor 750 and have dry gas inside. A desiccant material can be placed inside the hollow image sensor cover 730 and held in place by the image sensor cover 730 to absorb any moisture that is present ingresses through diffusion through the hollow image sensor cover 730 or the glue joint(s) in the assembly.

In another embodiment, the image sensor cover 730 can be in a form of at least one solid block bonded to the image sensor 750. The at least one solid block of the image sensor cover 730 can be made of acrylic and glass. It is noted that acrylic has a low thermal conductivity of 0.18 W/mK, which is suitable for isolation, but higher thermal expansion than that of glass, making it difficult to be bonded to glass.

In another embodiment, the at least one solid block of the image sensor cover 730 can be made of borosilicate having a thermal conductivity of 1.2 W/mK.

In another embodiment, the image sensor cover 730 can be in a form of at least one pocket bonded to the image sensor 750, with or without desiccant contained in the pocket. When the at least one pocket of the image sensor cover 730 does not include a desiccant, a dry gas such as Argon may be flowing through the pocket for removal of the moisture generated. The at least one pocket of the image sensor cover 730 can be made of acrylic or borosilicate glass.

Temperatures of the image sensor for different cooling structures of the image sensor cover 730 are measured and the results of the measurements are summarized in FIG. 38.

The image sensor cover 730 may include (1) a solid block made of acrylic and having a thickness of 12 mm; (2) a pocket made of acrylic and having a thickness of 12 mm; (3) a solid block made of acrylic and each having a thickness of 6 mm; (4) a pocket made of acrylic and each having a thickness of 6 mm; (5) a solid block made of borosilicate and each having a thickness of 6 mm; (6) a pocket made of borosilicate and each having a thickness of 6 mm; and (7) a pocket made of borosilicate and having a thickness of 12 mm. It is noted that a significantly lower image sensor temperature is achieved when the image sensor cover 730 includes four solid blocks made of borosilicate and each having a thickness of 6 mm.

Figure 26:
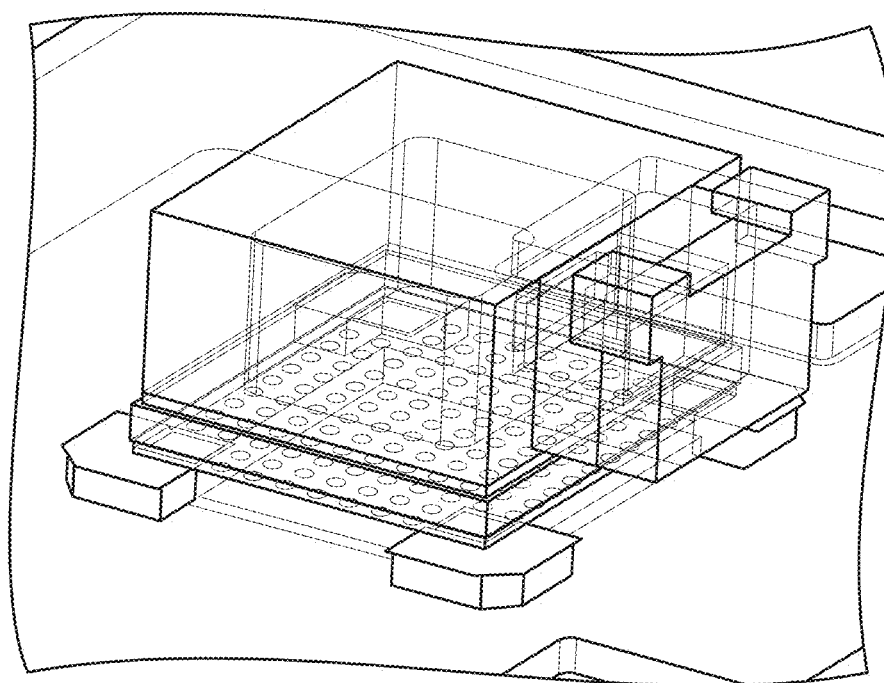
FIG. 26 is an assembled view of a first pocket with an enclosed desiccant of the image sensor cover according to an embodiment of the subject invention.

FIG. 26 is an assembled view of a first pocket with an enclosed desiccant of the image sensor cover according to an embodiment of the subject invention.

Figure 27:
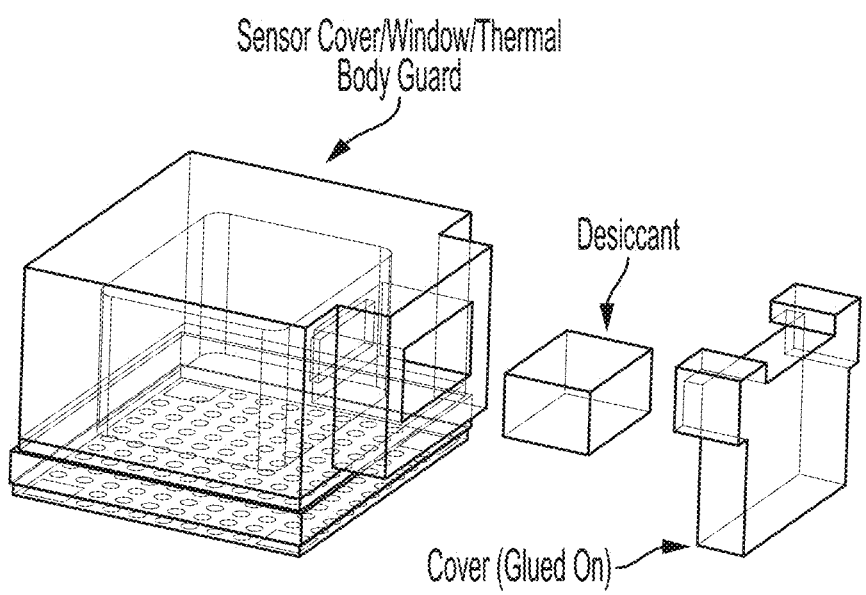
FIG. 27 is an explosive view of the first pocket with the enclosed desiccant of the image sensor cover according to an embodiment of the subject invention.

FIG. 27 is an explosive view of the first pocket with the enclosed desiccant of the image sensor cover according to an embodiment of the subject invention.

Figure 28:
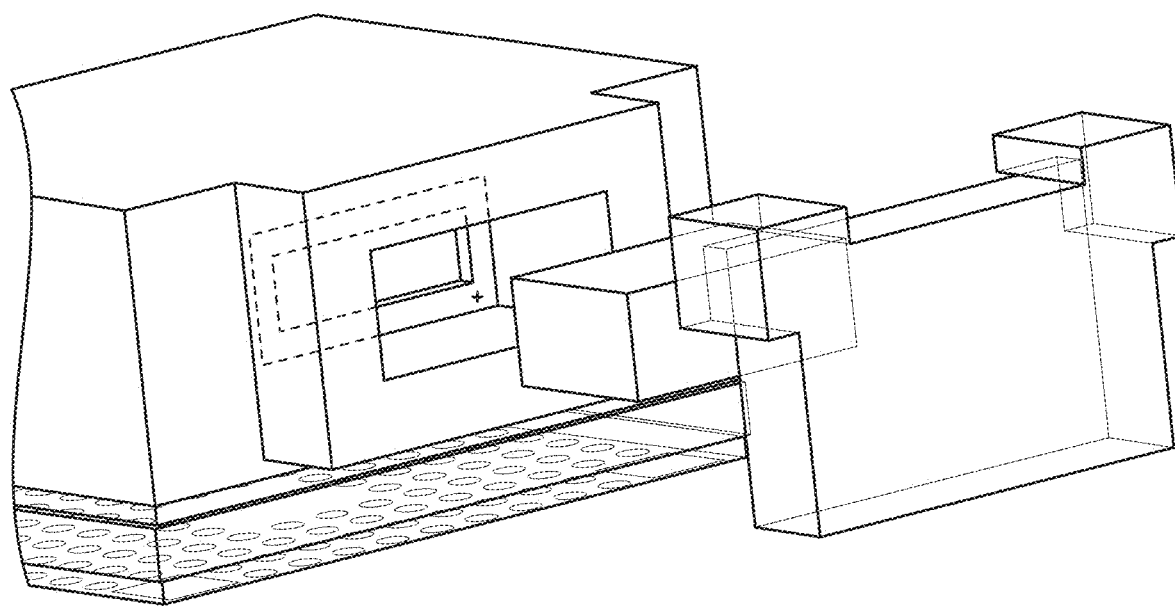
FIG. 28 is another explosive view of the first pocket with the enclosed desiccant of the image sensor cover, the first pocket having a structure keeping pellets from going in according to an embodiment of the subject invention.

FIG. 28 is another explosive view of the first pocket with the enclosed desiccant of the image sensor cover, the first pocket having a structure keeping pellets from going in according to an embodiment of the subject invention.

Figure 29:
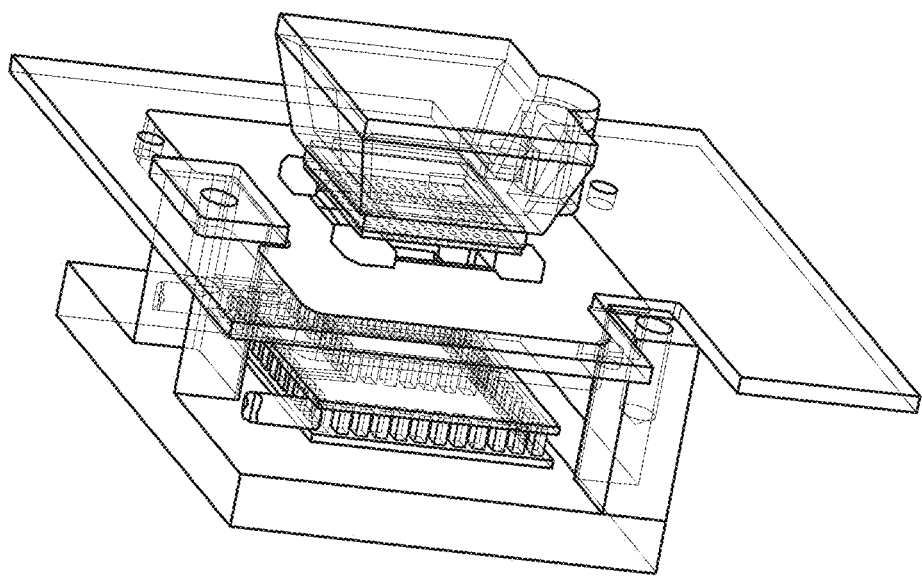
FIG. 29 is an assembled view of a second pocket with an enclosed desiccant of the image sensor cover according to an embodiment of the subject invention.

FIG. 29 is an assembled view of a second pocket with an enclosed desiccant of the image sensor cover according to an embodiment of the subject invention.

Figure 30:
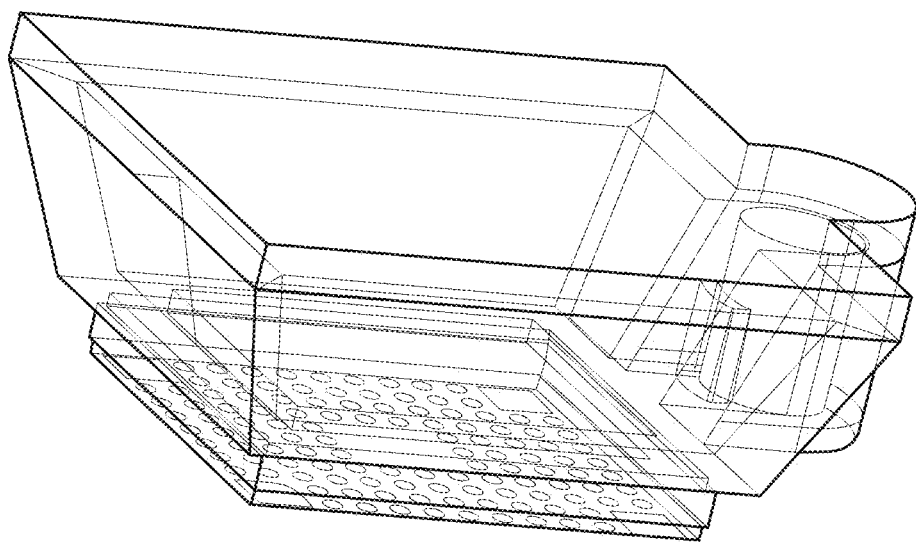
FIG. 30 is an explosive view of the second pocket with the enclosed desiccant of the image sensor cover according to an embodiment of the subject invention.

FIG. 30 is an explosive view of the second pocket with the enclosed desiccant of the image sensor cover according to an embodiment of the subject invention.

Figure 31:
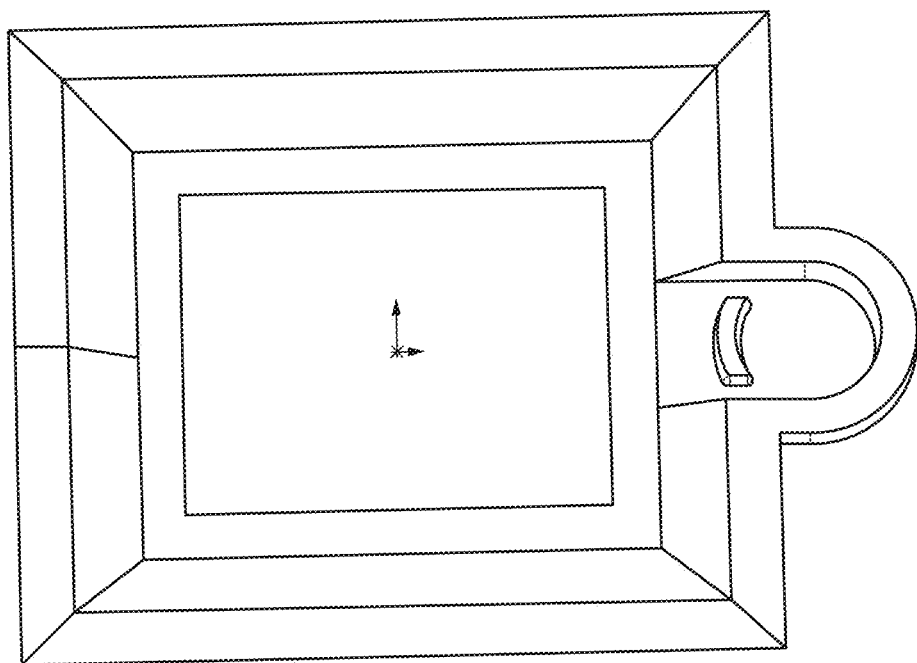
FIGS. 31 and 32 are respectively a top view and a side view of the second pocket with the enclosed desiccant according to an embodiment of the subject invention.
Figure 32:
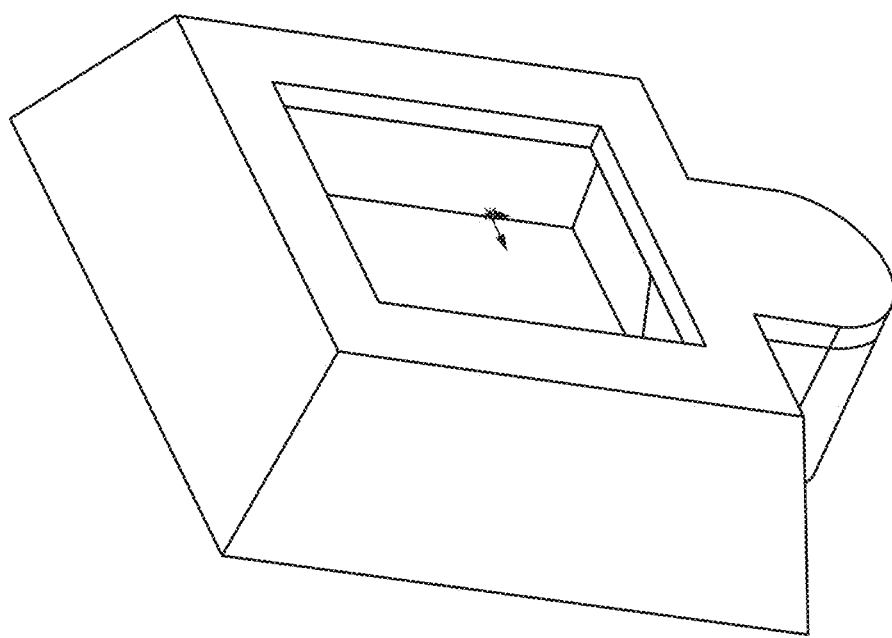

FIGS. 31 and 32 are respectively a top view and a side view of the second pocket with the enclosed desiccant according to an embodiment of the subject invention.

In another embodiment, the second pocket with the enclosed desiccant can be made from three machined, water jet, or laser cut parts, the second pocket having a flat lower part with a hole in it bonded to the image sensor, a four-sided wall part, and a flat top part.

The image sensor 750 is disposed on a top surface of the camera board fab 755 and can be a CCD, a CMOS, an organic image sensor, or other such imager which is coupled to the TEC 770 which can thereby cool the image sensor to maintain an operating temperature range for the image sensor. If components are disposed on the back side of the camera board fab 755, an intermediate highly thermally conductive heat conductor 760 can be positioned between the back surface of the camera board fab 755 and the TEC 770. The TEC 770 can draw thermal energy from the image sensor toward the heat sink 780 which can disperse the thermal energy or re-route the thermal energy to another element of the image sensor assembly 700. In one embodiment, the TEC may be configured to transfer heat away from the image sensor within the apparatus in any suitable manner, for example, by direct coupling to the image sensor or by indirect coupling to the image sensor using thermally conductive material such as cold finger structures where necessary or desirable.

In one embodiment, the image sensor assembly 700 can comprise a chamber structure in which a sample region, the image sensor, and the optical path are sealed or a chamberless structure in which the sample region, the image sensor, and the optical path are not sealed by a chamber.

Figure 20:
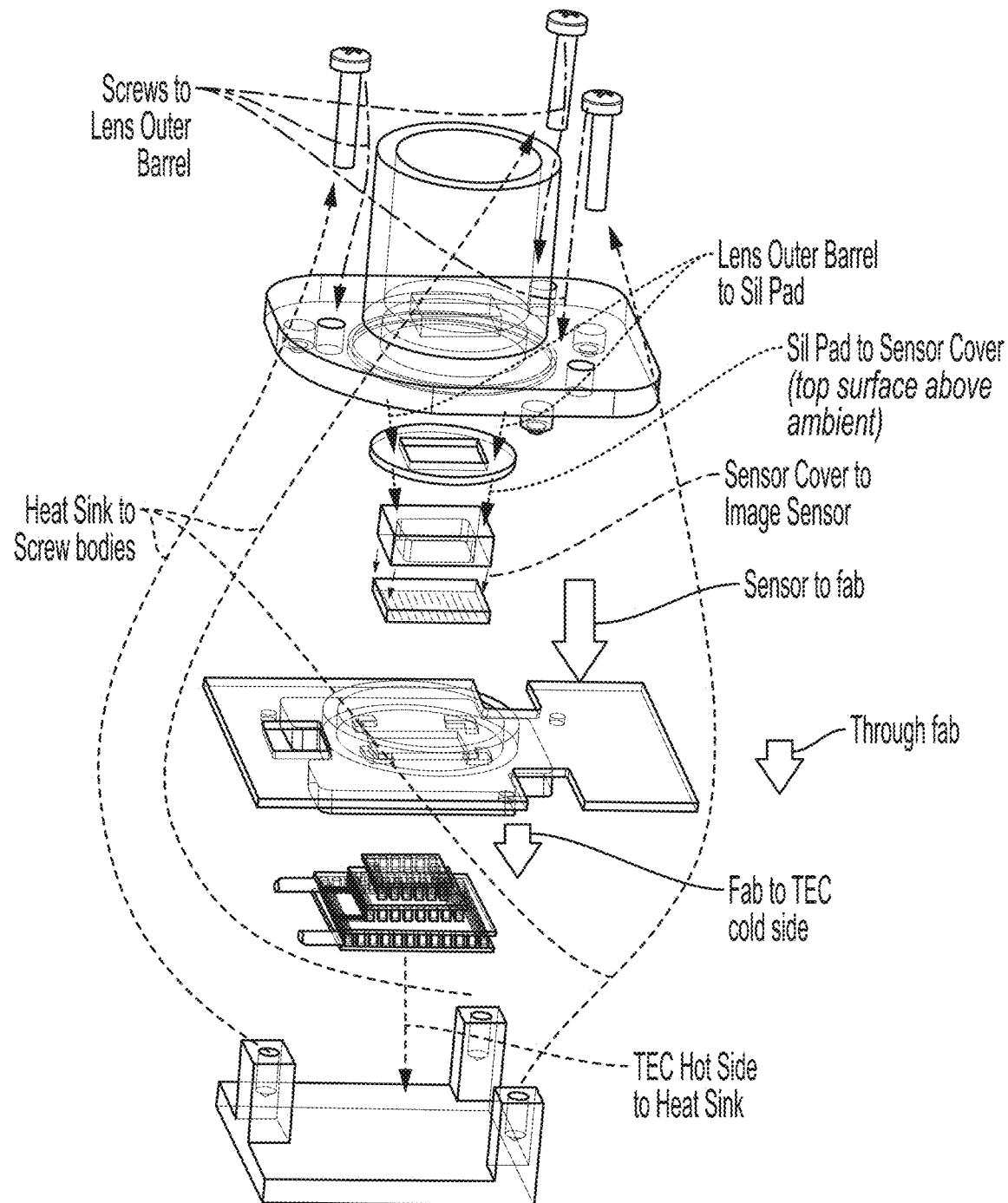
FIG. 20 is an exploded view of the image sensor assembly with active cooling by the thermoelectric cooling element (TEC), illustrating thermal communication and heat flow pathways throughout the image sensor assembly, according to an embodiment of the subject invention.

FIG. 20 illustrates thermal communication and heat flow pathways within the image sensor assembly 700, according to an embodiment of the subject invention. The heat is transferred up through the plurality of fasteners 790 to the lens outer barrel 710, from the lens outer barrel 710 to the contact material 720, from the contact material 720 to the image sensor cover 730, from the image sensor cover 730 to the image sensor 750, from the image sensor 750 to the camera board fab 755, from the camera board fab 755 to the heat conductor 760 if the heat conductor 760 is present, if not, then to the TEC 770, from the heat conductor 760 to the TEC 770, and from the TEC 770 to the heat sink 780.

In one embodiment, the image sensor assembly 700 with active cooling by a thermoelectric cooling element (TEC) can comprise a lens mount for mounting the lens, the lens mount and the image sensor 750 being horizontally disposed on a same surface of the camera board fab 755 to limit the number of parts between the image sensor 750 and the lens to reduce or eliminate the need for lens tilt alignment.

Figure 21:
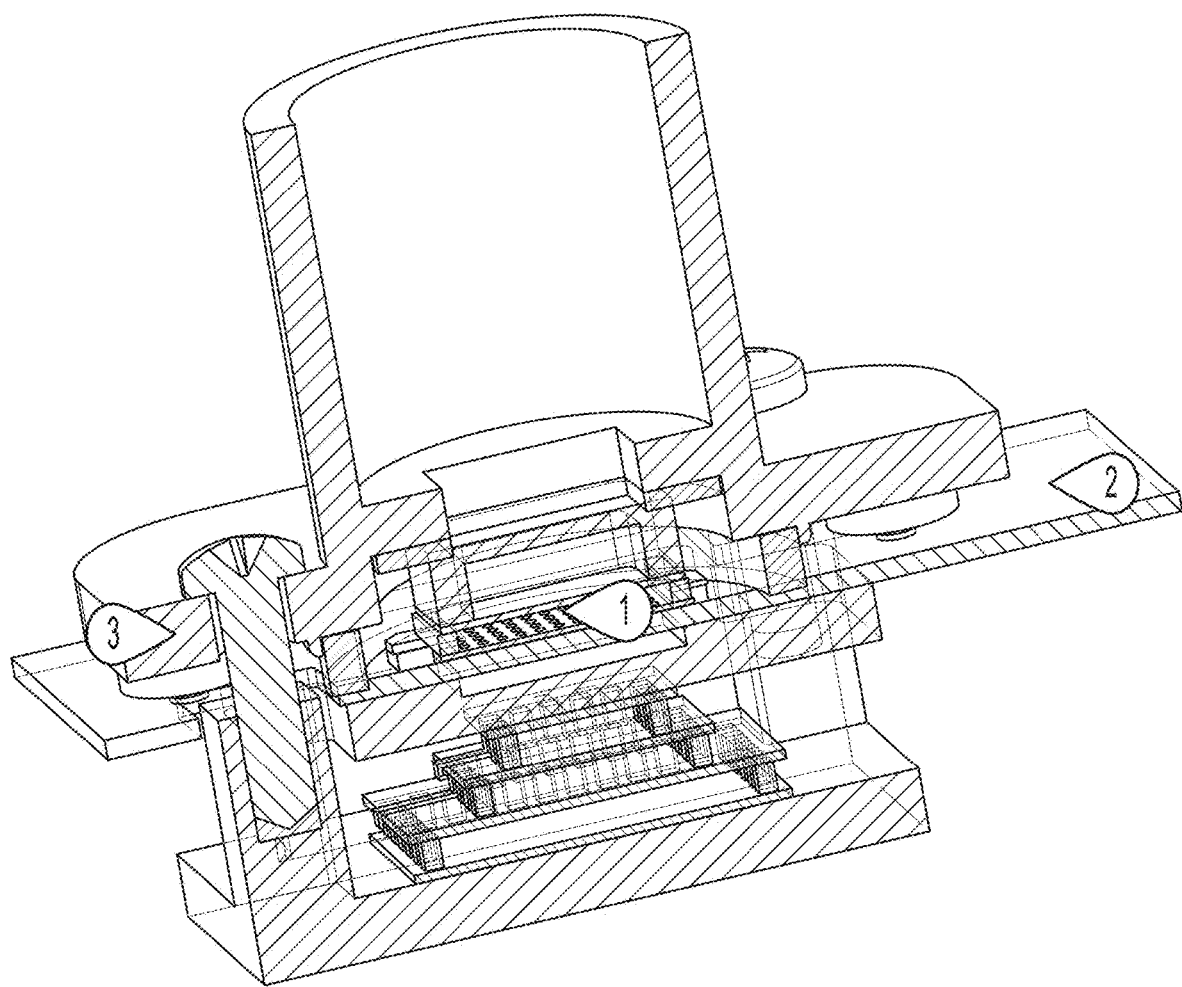
FIG. 21 is a cross-sectional view of the actively cooled image sensor assembly according to an embodiment of the subject invention.

FIG. 21 is a cross-sectional view of the actively cooled image sensor assembly according to an embodiment of the subject invention.

Figure 22:
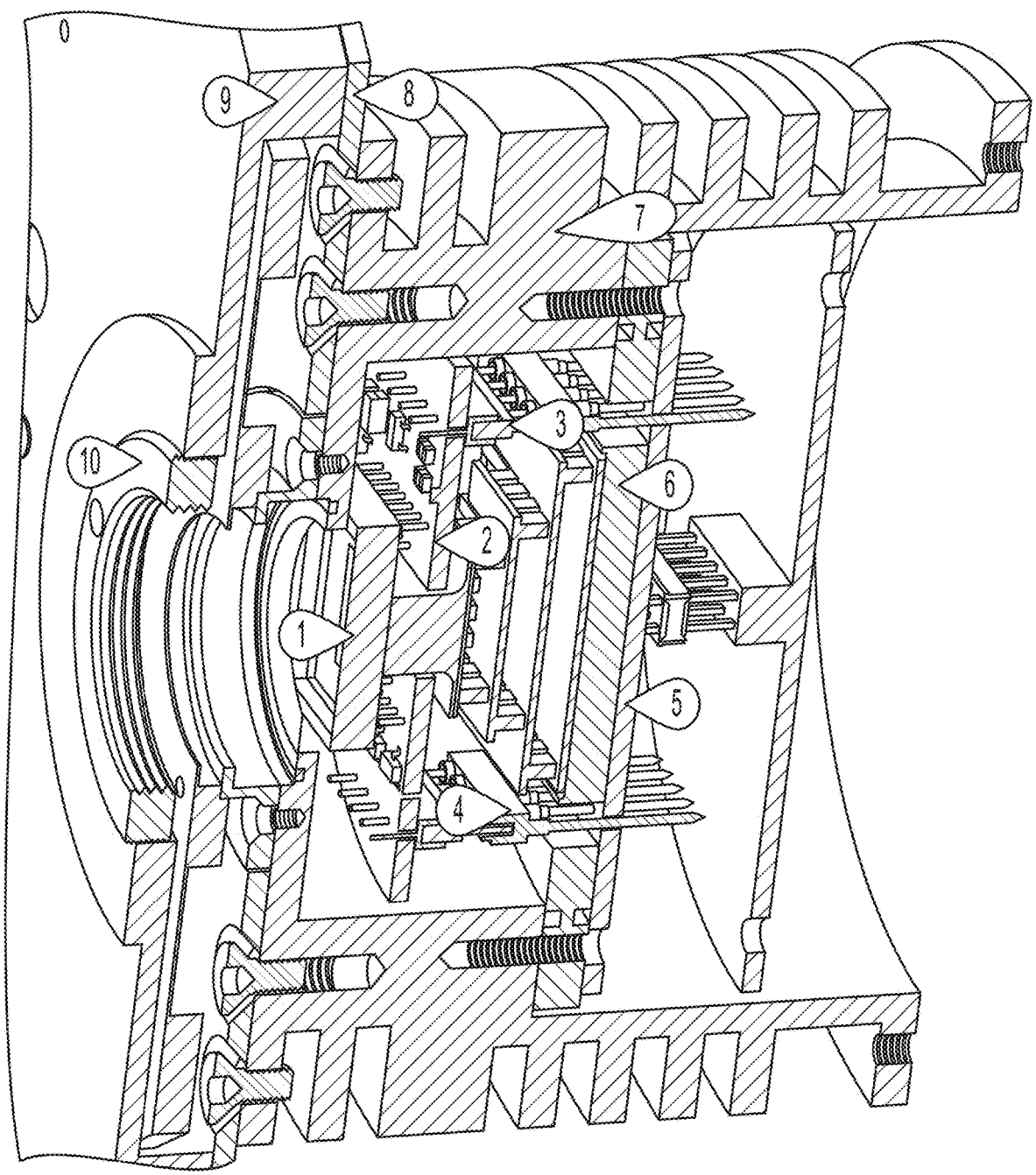
FIG. 22 is a cross-sectional view of the conventional image sensor assembly, showing ten parts between the image sensor and the lens, according to the related art.

FIG. 22 is a cross-sectional view of the conventional image sensor assembly, showing ten parts between the image sensor and the lens. In comparison, there are only three parts between the image sensor and the lens in the actively cooled image sensor assembly of FIG. 21 according to an embodiment of the subject invention.

In one embodiment, the image sensor assembly 700 can further comprise a plurality of gaskets 780 disposed between the lens outer barrel 710 and the camera board fab 755 to reduce heat transfer from the lens outer barrel 710 by reducing contact metal area while simultaneously blocking light. The gasket 780 may include a foam or like resilient inner member that is compressible, deformable or deflectable. Moreover, the image sensor assembly 700 can comprise a plurality of washers 790, preferably Belleville washers, respectively disposed between the plurality of gaskets 780 and the camera board fab 755 or between components of a multi-piece lens mount for tilt adjustment.

Figure 23:
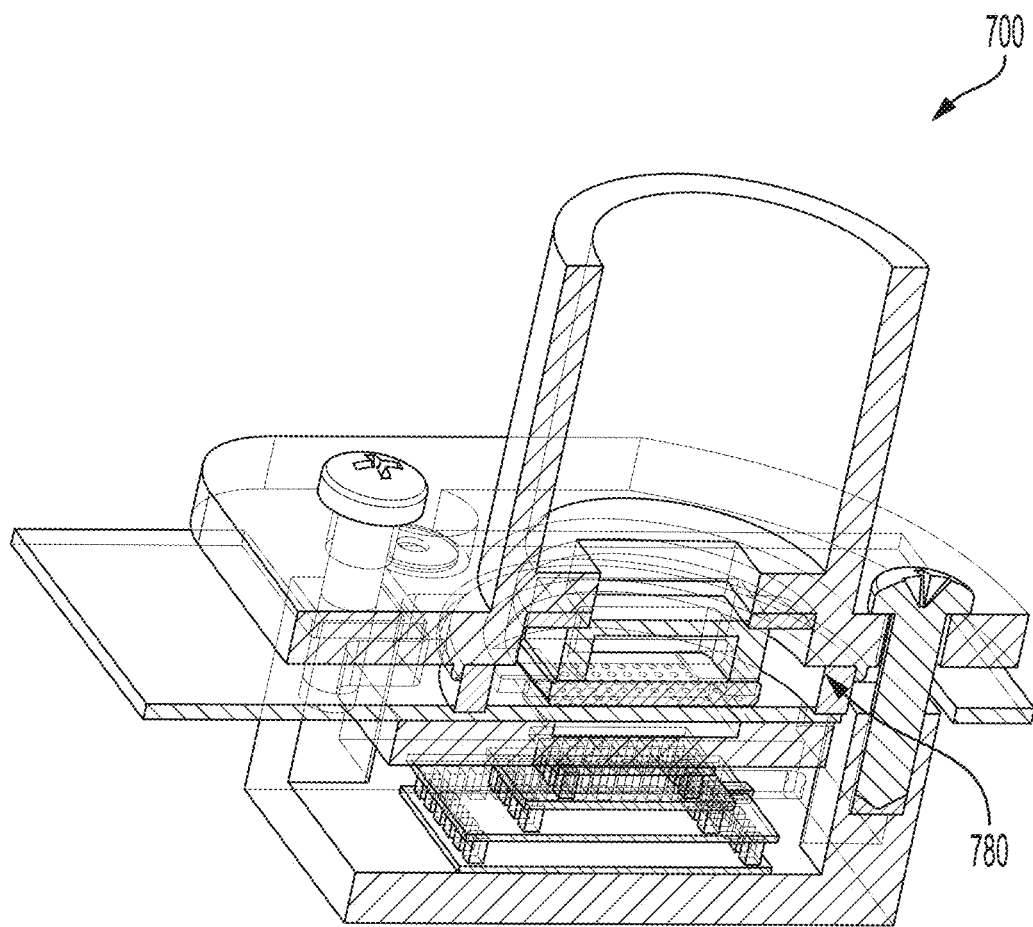
FIGS. 23-24 are cross-sectional views of the image sensor assembly with active cooling by the thermoelectric cooling element (TEC) and having a plurality of gaskets and washers, according to an embodiment of the subject invention.
Figure 24:
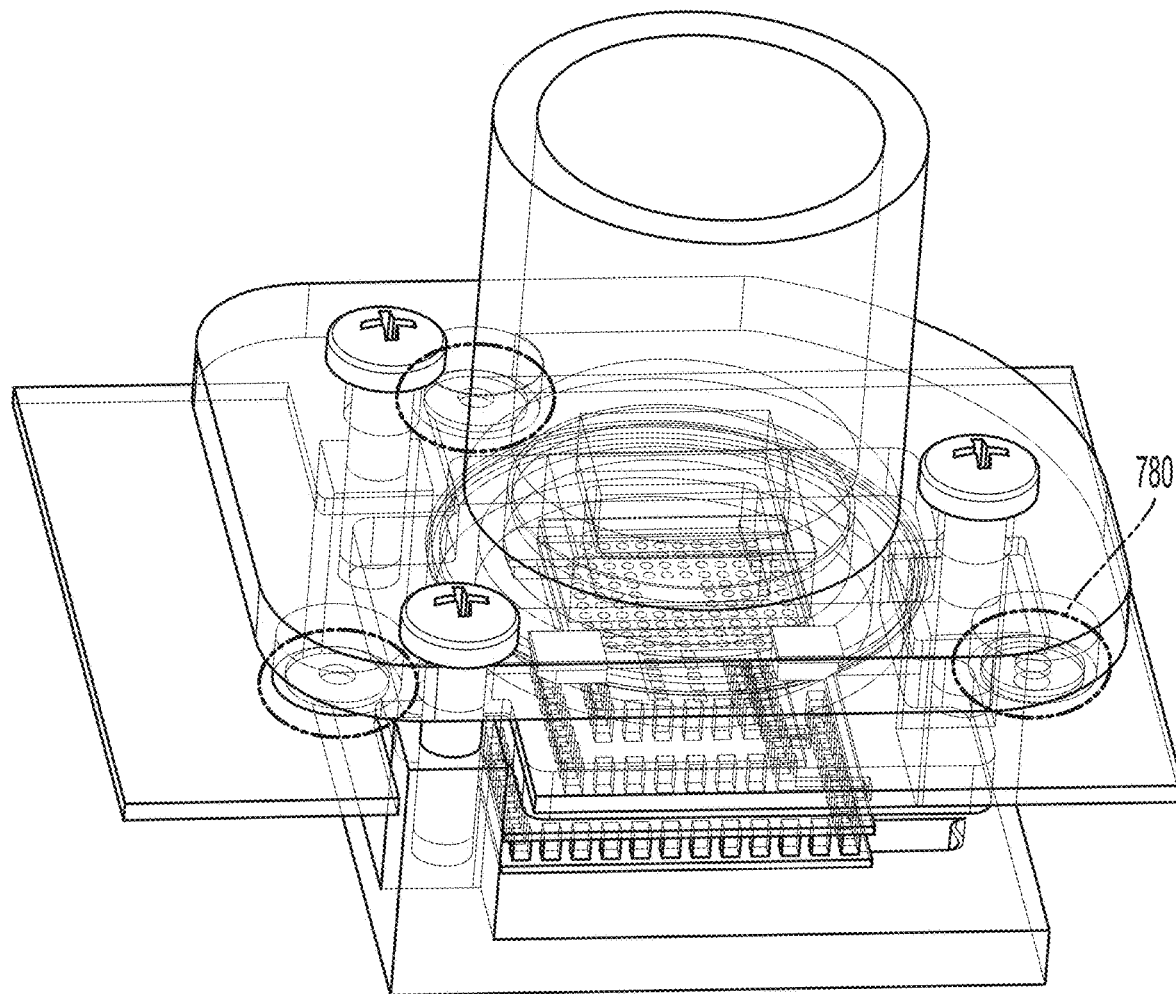

Referring to FIGS. 23 and 24, the image sensor assembly 700 with active cooling by a thermoelectric cooling element (TEC) comprising the plurality of gaskets 780 and the plurality of washers 790 are shown according to an embodiment of the subject invention.

The primary purpose of the gaskets 780 is to reduce heat transfer from the warm lens outer barrel which is in contact with the image sensor cover such as a pocket or a solid block. The waste heat is used to keep the front of the pocket or solid block sufficiently warm to inhibit condensation from forming on the surface of the image sensor cover. Moreover, the contact area between lens outer barrel 710 and the camera board fab 755 is reduced to a few small areas where the gaskets contact the camera board fab 755 and the gaskets 780 make up the intervening space to block light from getting to the image sensor.

Figure 25:
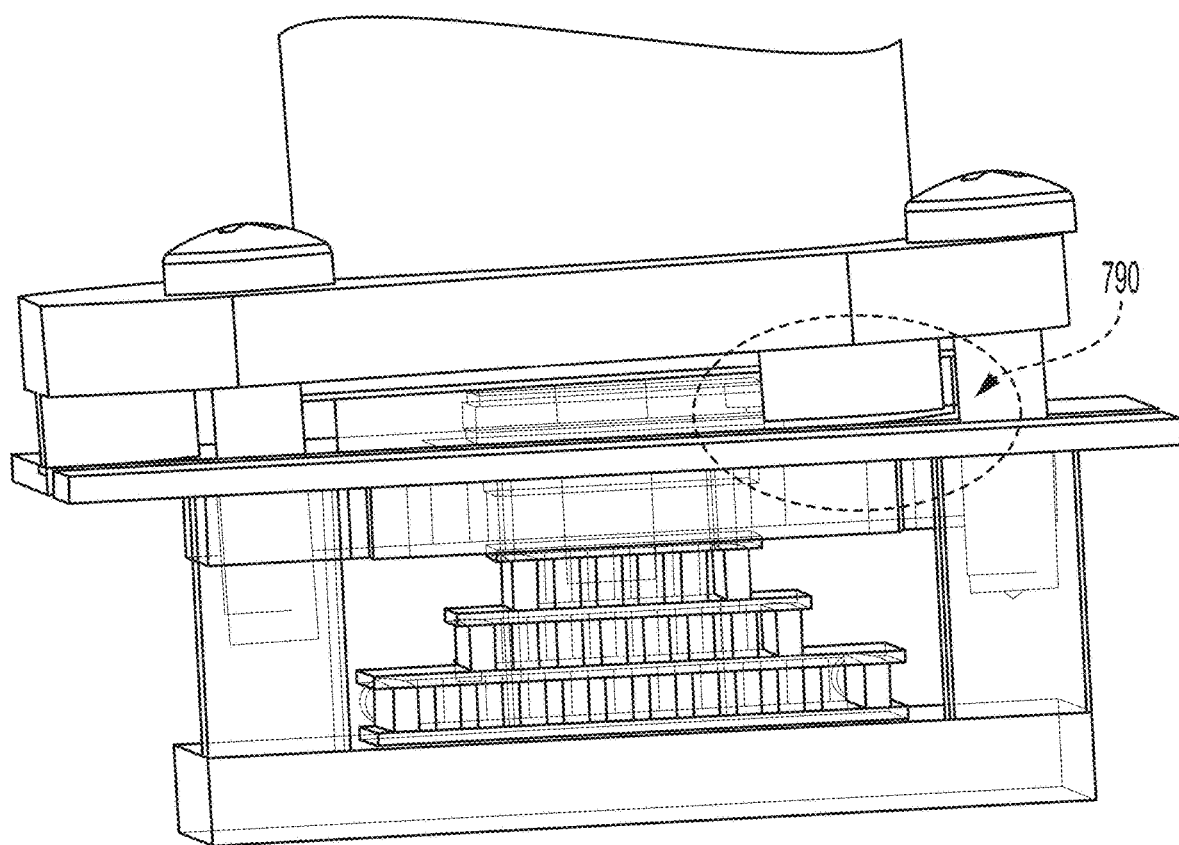
FIG. 25 is a cross-sectional view of the image sensor assembly with active cooling by the thermoelectric cooling element (TEC) and having a plurality of gaskets and washers, illustrating that the lens outer barrel is tilted, according to an embodiment of the subject invention.

FIG. 25 is a view of the image sensor assembly 700 with active cooling by the thermoelectric cooling element (TEC) and having a plurality of gaskets 780 and the plurality of washers 790, illustrating that the lens outer barrel is tilted, according to an embodiment of the subject invention. Since the gasket is there and is flexible and under compression, tilt adjustment can be made when needed, but loosening screws to allow Belleville washers under compression to push the mount outward slightly. It is noted that the lens outer barrel is tilted by 1 degree with respect to the blue line. It is noted that the separation of the right outer barrel attach surface, with uncompressed Belleville exposed.

In one embodiment, the image sensor assembly 700 may have a two-piece lens mount in which a first piece is mounted flat to the circuit board, a second piece is initially disposed plane-to-plane and can be configured to be tilted with respect to the circuit board, and the lens is mounted to the second piece. The two-piece lens mount allows easy assembly, checking for tilt after the assembly, and if no tilt is found, no adjustment is required to inhibit stress from washers locally compressing the circuit board.

In one embodiment of the uncooled version, a dark current of 0.11 e−/pixel/second is measured at room temperature which is 8.18 times lower than a dark current of 0.9 e−/pixel/second measured at room temperature for the conventional Sony IMX178 image sensor system.

In another embodiment, a dark current of 0.025 e−/pixel/second is measured at a temperature of 17° C. for the image sensor assembly with the active cooling by a TEC.

The subject invention includes, but is not limited to, the following exemplified embodiments.

Embodiment 1. An electronic component assembly, comprising:
- a circuit board comprising at least one thermal pad disposed on a top surface of the circuit board; and
- an image sensor disposed on the top surface of the circuit board, comprising at least one conductive pad disposed at at least one corner of the image sensor;
- wherein the at least one thermal pad is coupled to the at least one conductive pad of the image sensor; and
- wherein the at least one thermal pad is formed with a plurality of first thermal vias penetrating the thermal pad and the circuit board (e.g., for transfer of heat of the image sensor.

Embodiment 2. The electronic component assembly of embodiment 1, further comprising a thermally conductive layer disposed on a bottom surface of the circuit board.

Embodiment 3. The electronic component assembly of embodiment 2, wherein the thermally conductive layer is made of metal.

Embodiment 4. The electronic component assembly of embodiment 2, wherein the thermally conductive layer has a circular or annular shape.

Embodiment 5. The electronic component assembly of embodiment 2, wherein the thermally conductive layer is formed with a plurality of second thermal vias penetrating the thermally conductive layer to transfer heat.

Embodiment 6. The electronic component assembly of embodiment 2, wherein the second thermal vias are spaced in the thermally conductive layer.

Embodiment 7. The electronic component assembly of embodiment 3, wherein the metal comprises copper (Cu) or copper alloy.

Embodiment 8. The electronic component assembly of embodiment 2, further comprising a thermal compound material applied between corner areas of the image sensor and the corner areas of the thermal pad comprising the thermal vias and extending along lengths of the thermal pad to be in contact with the top surface of circuit board.

Embodiment 9. The electronic component assembly of embodiment 1, wherein at least one of the plurality of first thermal vias has a shape of a cylinder.

Embodiment 10. The electronic component assembly of embodiment 1, wherein at least one of the plurality of first thermal vias is made of copper (Cu) or copper alloy.

Embodiment 11. The electronic component assembly of embodiment 1, wherein at least one of the plurality of first thermal vias is filled with a thermally conductive material.

Embodiment 12. The electronic component assembly of embodiment 1, wherein the at least one conductive pad comprises a plurality of conductive pads electrically connected with each other.

Embodiment 13. The electronic component assembly of embodiment 1, further comprising a cooling structuring coupled to the circuit board (e.g., for transferring heat).

Embodiment 14. The electronic component assembly of embodiment 13, wherein the cooling structuring comprises at least one cold finger structure.

Embodiment 15. The electronic component assembly of embodiment 13, wherein the cooling structure protrudes through a through-hole of the circuit board and contacts a surface of the image sensor (e.g., for transferring heat).

Embodiment 16. The electronic component assembly of embodiment 1, further comprising a lens mount (e.g., for mounting the lens), the lens mount and the image sensor being horizontally disposed on a same surface of the circuit board.

Embodiment 17. An image sensor assembly, comprising:
- a cooling structure comprising at least one thermoelectric cooling element (TEC);
- a circuit board disposed on the cooling structure;
- an image sensor; and
- a lens.

Embodiment 18. The image sensor assembly according to embodiment 17, further comprising an image sensor cover disposed on the image sensor.

Embodiment 19. The image sensor assembly according to embodiment 18, wherein the lens and the image sensor cover are directly or indirectly coupled.

Embodiment 20. The image sensor assembly according to embodiment 19, further comprising a lens outer barrel in contact with the image sensor cover.

Embodiment 21. The image sensor assembly according to embodiment 20, further comprising a heat sink structure coupled to the cooling structure.

Embodiment 22. The image sensor assembly according to embodiment 21, further comprising a plurality of fasteners coupling the lens outer barrel to the heat sink structure.

Embodiment 23. The image sensor assembly according to embodiment 22, wherein the image sensor assembly comprises a structure with a chamber or a structure without a chamber.

Embodiment 24. The image sensor assembly according to embodiment 17, wherein heat is transferred from the lens outer barrel to to the image sensor cover directly or indirectly through a contact material, from the image sensor cover to the image sensor, from the image sensor to the circuit board, from the circuit board to the cooling structure, from the cooling structure to the heat sink.

Embodiment 25. The image sensor assembly according to embodiment 23, further comprising a plurality of gaskets disposed between the lens outer barrel and the circuit board to reduce heat transfer from the lens outer barrel, and a plurality of reduced contact areas where the gaskets contact the circuit board and the gaskets make up the intervening space to block stray light from reaching the image sensor.

Embodiment 26. The image sensor assembly according to embodiment 25, further comprising a plurality of washers respectively disposed between the plurality of gaskets and the circuit board (e.g., for tilt adjustment).

Embodiment 28. The image sensor assembly according to embodiment 17, further comprising a lens mount (e.g., for mounting the lens), the image sensor and the lens mount being horizontally disposed on a same plane of the circuit board.

Embodiment 29. The image sensor assembly according to embodiment 17, further comprising a lens mount (e.g., for mounting the lens), the image sensor and the lens mount being disposed to vertically overlap on a top surface of the circuit board.

Embodiment 30. The image sensor assembly according to embodiment 22, wherein the plurality of fasteners comprises at least one screw comprising a metal (e.g., for increasing or maximizing heat conduction).

Embodiment 31. The image sensor assembly according to embodiment 26, wherein the plurality of washers comprises at least one Belleville washer.

As a person skilled in the art of gel and blot imaging will recognize from the previous detailed description and from the figures and claims, modifications and changes can be made to the embodiments of the invention without departing from the scope of this invention defined in the following claims.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An electronic component assembly, comprising:
   a circuit board comprising at least one thermal pad disposed on a top surface of the circuit board;
   an image sensor disposed on the top surface of the circuit board, comprising at least one conductive pad disposed at at least one corner of the image sensor; and
   a thermally conductive layer disposed on a bottom surface of the circuit board,
   wherein the at least one thermal pad is coupled to the at least one conductive pad of the image sensor,
   wherein the at least one thermal pad is formed with a plurality of first thermal vias penetrating the thermal pad and the circuit board, and
   wherein the thermally conductive layer has a circular or annular shape.

2. The electronic component assembly of claim 1, further comprising a lens mount, the lens mount and the image sensor being horizontally disposed on a same surface of the top surface of the circuit board.

3. The electronic component assembly of claim 1, wherein the thermally conductive layer is made of metal and formed with a plurality of second thermal vias penetrating the thermally conductive layer to transfer heat.

4. The electronic component assembly of claim 1, further comprising a thermal compound material applied between corner areas of the image sensor and the corner areas of the thermal pad comprising the thermal vias and extending along lengths of the thermal pad to be in contact with the top surface of the circuit board.

5. The electronic component assembly of claim 1, wherein at least one of the plurality of first thermal vias has a shape of a cylinder.

6. The electronic component assembly of claim 5, wherein at least one of the plurality of first thermal vias is filled with a thermally conductive material.

7. The electronic component assembly of claim 1, wherein at least one of the plurality of first thermal vias is filled with a thermally conductive material.

8. The electronic component assembly of claim 1, wherein at least one of the plurality of first thermal vias is formed with copper (Cu) or copper alloy.

9. The electronic component assembly of claim 1, further comprising a cooling structure coupled to the circuit board.

10. The electronic component assembly of claim 9, wherein the plurality of first thermal vias is disposed directly under the conductive pad of the image sensor on the top surface of the circuit board, wherein the plurality of first thermal vias are filled with a thermal conductive material.

11. The electronic component assembly of claim 9, wherein the cooling structure protrudes through a through-hole of the circuit board and contacts a surface of the image sensor.

12. An image sensor assembly, comprising:
    a cooling structure comprising at least one thermoelectric cooling element (TEC);
    a circuit board disposed on the cooling structure;
    an image sensor;
    a lens;
    an image sensor cover disposed on the image sensor;
    a lens outer barrel in contact with the image sensor cover;
    a plurality of gaskets disposed between the lens outer barrel and the circuit board to reduce heat transfer from the lens outer barrel; and
    a plurality of reduced contact areas where the gaskets contact the circuit board and the gaskets make up the intervening space to block stray light from reaching the image sensor.

13. The image sensor assembly according to claim 12, wherein the image sensor assembly comprises a structure with a chamber or a structure without a chamber.

14. The image sensor assembly according to claim 12, further comprising a plurality of washers respectively disposed between the plurality of gaskets and the circuit board.

15. The image sensor assembly according to claim 12, further comprising a lens mount, the image sensor and the lens mount being horizontally disposed on a same plane of a top surface of the circuit board.

16. The image sensor assembly according to claim 12, further comprising a lens mount, the image sensor and the lens mount being disposed to vertically overlap on a top surface of the circuit board.

* * * * *